US007529377B2

(12) United States Patent
Nackvi et al.

(10) Patent No.: US 7,529,377 B2
(45) Date of Patent: May 5, 2009

(54) LOUDSPEAKER WITH AUTOMATIC CALIBRATION AND ROOM EQUALIZATION

(75) Inventors: Fawad Nackvi, Westfield, IN (US); Jon Douglas Zenor, Greenwood, IN (US)

(73) Assignee: Klipsch L.L.C., Indianapolis, IN (US)

( * ) Notice: Subject to any disclaimer, the term of this patent is extended or adjusted under 35 U.S.C. 154(b) by 354 days.

(21) Appl. No.: 11/460,846

(22) Filed: Jul. 28, 2006

(65) Prior Publication Data

US 2007/0025557 A1 Feb. 1, 2007

Related U.S. Application Data

(60) Provisional application No. 60/703,625, filed on Jul. 29, 2005.

(51) Int. Cl.
*H03G 5/00* (2006.01)
*H04R 29/00* (2006.01)

(52) U.S. Cl. ........................................ 381/103; 381/59

(58) Field of Classification Search ............ 381/55-59, 381/61, 63, 102, 103, 106, 95-98; 333/28 R
See application file for complete search history.

(56) References Cited

U.S. PATENT DOCUMENTS 3,937,887 A * 2/1976 Miller ........................ 381/96
4,458,362 A * 7/1984 Berkovitz et al. ........... 381/103
4,661,982 A 4/1987 Kitazato et al.
4,823,391 A * 4/1989 Schwartz .................... 381/103
5,506,910 A * 4/1996 Miller et al. ................ 381/103
5,596,650 A * 1/1997 Hlibowicki ................. 381/103
5,617,480 A 4/1997 Ballard et al.
5,771,297 A 6/1998 Richardson
6,072,879 A 6/2000 Ouchi et al.
6,195,435 B1 2/2001 Kitamura
6,359,994 B1 3/2002 Markow et al.
6,519,344 B1 2/2003 Yajima et al.
6,721,428 B1 4/2004 Allred et al.
6,760,451 B1 7/2004 Caven et al.
7,409,067 B2 * 8/2008 Yoshino ....................... 381/98
2001/0018621 A1 8/2001 Weikel et al.
2001/0038702 A1 11/2001 Lavoie et al.
2002/0149704 A1 10/2002 Kano et al.
2002/0159606 A1 10/2002 Hobelsberger
2003/0099365 A1 5/2003 Karjalainen et al.
2003/0179891 A1 9/2003 Rabinowitz et al.
2004/0057587 A1 * 3/2004 Thiel ........................... 381/98
2004/0105558 A1 6/2004 Montag et al.
2005/0069153 A1 3/2005 Hall et al.
2005/0195982 A1 * 9/2005 Olive .......................... 381/59
2006/0050891 A1 * 3/2006 Bharitkar ..................... 381/59

OTHER PUBLICATIONS

Louis D. Fielder and Eric M. Benjamin, *Subwoofer Performance for Accurate Reproduction of Music*, J. Audio Eng. Soc., pp. 443-456, vol. 36, No. 6, Jun. 1988.

(Continued)

*Primary Examiner*—Xu Mei
(74) *Attorney, Agent, or Firm*—Baker & Daniels LLP

(57) ABSTRACT

A loudspeaker, such as a subwoofer, is provided which automatically calibrates itself when placed in a room to optimize an output signal of the loudspeaker for the room in which the loudspeaker is placed.

35 Claims, 27 Drawing Sheets

OTHER PUBLICATIONS

Richard V. Waterhouse, *Output of a Sound Source in a Reverberation Chamber and Other Reflecting Environments*, The Journal of the Acoustical Society of America, vol. 30, No. 1, Jan. 1958, pp. 4, 8.

Roy F. Allison, *The Influence of Room Boundaries on Loudspeaker Power Output*, Journal of the Audio Engineers Society; vol. 22, No. 5, Jun. 1974, pp. 314-320.

J. R. Wright, *An Exact Model of Acoustic Radiation in Enclosed Spaces*, An Audio Engineering Society Preprint; Presented at the 96th Convention Feb. 26-Mar. 1, 1994 Amsterdam, pp. 1-13.

L. E. Kinsler, et al., *Cavities and Waveguides*, Fundamentals of Acoustics Fourth Edition; pp. 246-248; Wiley, New York, 1962.

Allen R. Groh, *High-Fidelity Sound System Equalization by Analysis of Standing Waves*, Journal of the Audio Engineers Society, Dec. 1974, pp. 795-799, vol. 22, No. 10.

F. Alton Everest, *Modal Resonances in Enclosed Spaces*, Master Handbook of Acoustics Fourth Edition, pp. 317-351, McGraw Hill, 2001.

A.H. Gray and J.D. Markel, *A normalized digital filter structure*, IEEE Transactions on Acoustics, Speech and Signal Processing, pp. 268-277, vol. ASSP-23, No. 3, Jun. 1975.

*Digital Drive Software Version 2.0 Introcution and Features Summary*, Velodyne Acoustics, Inc., May 2005, Two pages.

*Digital Drive Series User's Manual Featuring Software Version 2.0*, Velodyne Acoustics, Inc., 2005, pp. 1-51.

*Velodyne Digital Drive Series Brochure*, Velodyne Acoustics, Inc. 4 pgs, 2003.

* cited by examiner

LOUDSPEAKER WITH AUTOMATIC CALIBRATION AND ROOM EQUALIZATION

CROSS REFERENCE TO RELATED APPLICATION

This application also claims the benefit of U.S. Provisional Application Ser. No. 60/703,625, filed on Jul. 29, 2005, which is expressly incorporated by reference herein.

BACKGROUND AND SUMMARY OF THE INVENTION

The present invention relates to loudspeakers. More particularly, the present invention relates to a loudspeaker, such as a subwoofer, which automatically calibrates itself when placed in a room to optimize an output signal of the loudspeaker for the room in which the loudspeaker is placed.

Designing speaker systems to produce high quality sound in home settings is a difficult task. Particularly, in the case of a subwoofer, the room in which the subwoofer is placed can cause standing waves or room modes which decrease sound quality.

More and more people are setting up high-end home theaters with at least one subwoofer as part of their system. These high-end systems are now approaching the performance of professional systems. When these high-end systems are put in a typical room, the room will often adversely affect the sound quality. Professional systems are usually installed in listening rooms that are carefully designed and which often use acoustic diffusers and sound-absorption material to improve the room acoustics. Most home users are un-likely to go to such length to improve their own home-theater or listening room. Either way, sound treatment of rooms with diffusers and absorption may still not produce a good acoustic room or it may only be optimal for just one position for the placement of speakers. Even in the most well designed room, standing waves exist that may make the low frequency response of the room un-even. The present invention electronically measures and quantifies these offending standing waves and reduces them to acceptable levels. The additional benefit of doing this is calibrating the room and having a known Sound Pressure Level (SPL). SPL measurements are made in decibels to reflect how loud a sound is perceived to be compared to the threshold of hearing.

The subwoofer of the illustrated embodiment, in addition to equalizing the room at low frequencies, has a number of other features. The illustrated subwoofer includes a USB and RS-232 control via a Personal Computer (PC) or home automation system, an advanced PC based GUI (Graphical User Interface), LCD display, SPL meter, firmware upgrades, remote control, diagnostic mode, demonstration mode, presets to store user preferences and settings in memory, tamper proof serial number, advanced limiter and is also capable of being connected to one or more subwoofers.

The following listed references are incorporated by reference herein. Throughout the specification, these references are referred to by citing to the numbers in the brackets [#] corresponding to each reference.

[1] *Subwoofer Performance for Accurate Reproduction*, Louis D. Fielder, Eric M. Benjamin, AES 83$^{rd}$ convention October 1987

[2] *Output of a Sound Source in a Reverberation Chamber and Other Reflecting Environments*, Richard V. Waterhouse, Journal of the Acoustical Society of America January 1958

[3] *The Influence of Room Boundaries on Loudspeaker Power Output*, Roy F. Allison, Journal of the Audio Engineers Society, June 1974

[4] *An Exact Model of Acoustic Radiation in Enclosed Spaces*, J. R. Wright, AES 96$^{th}$ convention February 1994

[5] *Fundamentals of Acoustics*, L. E. Kinsler, A. R. Frey, Wiley, New York, 1962

[6] *High-Fidelity Sound System Equalization by Analysis of Standing Waves*, Allen R. Groh, Journal of the Audio Engineers Society, June 1974

Fielder and Benjamin in their paper [1] show that a 1 dB difference at low frequencies is just audible. Thus for accurate reproduction the subwoofer should be flat to within ±0.5 dB. They also state that room acoustics prevent the realization of such a goal. The embodiments disclosed herein provide results that approach this goal.

Waterhouse [2] plotted a room or boundary gain for a source with respect to distance. He showed that the boundary gain can be as much as 9 dB and is highest at the lowest frequencies with a slope of 12 dB per octave. As the sound source is moved away from the boundary, the gain remains the same but now occurs at a lower frequency. What is important to note, is that the slope at the lowest frequencies (12 per octave) remains the same. The situation is a little more complicated in a room as sound can be reflected back and forth repeatedly. However Waterhouse [2] shows his results are valid for rooms too. The results hold for any sized room, large or small. The size of the room is not relevant, just the distance from the walls is important. Allison [3] also presented 1974.

A subwoofer is usually positioned close to three boundaries (i.e. ⅛ space) as the ceiling of a room is acoustically too far away too make a difference to the frequency response. The room modes at the lowest frequencies are pretty sparse, see Table 1 from Wright [4].

TABLE 1

Table of standing waves for a room of dimensions 4 m × 6 m × 2.5 m

| Mode Number | Frequency Hz | Mode Order(WLH) |
|---|---|---|
| 1 | 28.58 | 010 |
| 2 | 42.88 | 100 |
| 3 | 51.53 | 110 |
| 4 | 57.17 | 020 |
| 5 | 68.60 | 001 |
| 6 | 71.46 | 120 |
| 7 | 74.32 | 011 |
| 8 | 80.90 | 101 |
| 9 | 85.75 | 030 |
| 10 | 85.75 | 200 |
| 11 | 85.80 | 111 |
| 12 | 89.30 | 021 |

Thus in the region of interest in calibrating a room, the slope we are interested in, is from 15 Hz to 25 Hz. For an average sized room of dimensions 4 m×6 m×2.5 m only one room exists near that band and it is at a frequency of 28.58 Hz. This means a subwoofer will produce the same signal between 15 Hz to 25 Hz in a normally constructed as in ⅛ space with only a gain difference between them.

Traditional methods of room equalization, both analog and digital have included ⅓-octave equalizers. To understand why this and other methods are inadequate consider a rectangular room with the dimension $l_x$, $l_y$ and $l_z$. Kinsler and Frey [5] developed the equation for the modes of the room as:

$$F_{xyz} = \frac{c}{2}\sqrt{\left(\frac{n_x}{l_x}\right)^2 + \left(\frac{n_y}{l_y}\right)^2 + \left(\frac{n_z}{l_z}\right)^2}$$

Where $n_x$, $n_y$, $n_z$=0, 1, 2, 3 . . .

And c is the speed of sound.

This equation's predicted room modes for the room of dimensions 4 m×6 m×2.5 m are listed in Table 1. The modes are very few at the lowest frequencies and progressively increase as the frequency goes up. Around 1 kHz the room modes have increased to a few thousand. The discrete number of room modes, only 12 at frequencies up to 90 Hz, show up as broad peaks and dips in the frequency response. The low frequency room modes bandwidth is dependent on the reverberation time. The lower the reverberation time, the larger the bandwidth, i.e. a room with very reflective walls and very little energy absorption at low frequencies will have very narrow room modes. Table 2, lists the relationship between modal bandwidth and reverberation time.

TABLE 2

Table of Mode Bandwith

| Reverberation Time (s) | Mode Bandwidth (Hz) |
|---|---|
| 0.2 | 11 |
| 0.3 | 7 |
| 0.4 | 5.5 |
| 0.5 | 4.4 |
| 0.8 | 2.7 |
| 1.0 | 2.2 |

So, for a typical room, the long reverberation time makes the room modes more discrete. Q is related to the bandwidth with the following equation:

$$N = \log_2\left(\frac{f_U}{f_C}\right)$$

$$Q = \frac{\sqrt{2^N}}{2^N - 1}$$

Where N is the bandwidth in octaves, $f_c$ is the center frequency of the mode, $f_u$ is the upper frequency at the −3 db point of the room mode. So, for example, with a reverberation time of 0.8 seconds, the mode bandwidth is 2.7 Hz. That means the lowest mode which is at 28.58 Hz is 0.07 octaves wide and has a Q of 20!! A ⅓ octave equalizer has a Q of 4.3. At higher frequencies of interest (like 70 Hz to 120 Hz) the discrete room modes will bunch together to produce a lower Q but this is totally dependent on the room dimension and the reverberation time of the room.

Groh [6] has shown that using pink noise to take a room response measurement will lead to an overly smoothed frequency response that will hide the peaky (high Q) nature of the room. If a chirp is used it must be long enough to get a good response of the room otherwise the measurement will be overly smoothed as with a pink noise measurement. Another technique is to use a MLS sequence but speaker non-linearity can corrupt the measurement.

According to an illustrated embodiment, a method of improving sound quality of a loudspeaker in a room is provided. The method includes providing a reference frequency response signal indicating a desired frequency response for the loudspeaker, measuring a frequency response of an output of the loudspeaker in the room, comparing the measured frequency response in the room to the reference frequency response signal, identifying at least one peak in the measured room frequency response which has a higher sound level than corresponding a sound level of the reference frequency response signal, and modifying the output of the loudspeaker to reduce the at least one peak identified in the identifying step without adjusting portions of the output of the loudspeaker having sound levels below corresponding sound levels of the reference frequency response signal.

Illustratively, the detecting step includes measuring a peak sound level generated in the room by the output of the loudspeaker at predetermined time intervals and storing the measured peak sound levels corresponding to different frequencies within the frequency range of the chirp sequence. Also illustratively, the method further includes converting the measured peak sound levels to sound pressure levels.

In another illustrated embodiment, the measuring step includes measuring a frequency response of the output signal in at least two different locations in the room and determining a combined measured frequency response based on the frequency response measurements taken in the at least two different locations in the room.

According to another illustrated embodiment, a method of improving sound quality of a loudspeaker in a room is provided. The method includes providing a reference frequency response signal indicating a desired frequency response for the loudspeaker, placing the loudspeaker in the room, initiating a chirp sequence over a predetermined frequency range for a predetermined time period greater than 10 seconds, detecting sound levels of an output of the loudspeaker at different frequencies within the frequency range during the chirp sequence, storing the detected sound levels to provide a measured frequency response of the output of the loudspeaker in the room, comparing the measured frequency response to the reference frequency response signal, and modifying the output of the loudspeaker based on the results of the comparing step.

In another example, the predetermined time period of the chirp sequence is greater than or equal to 48 seconds. In yet another example, the predetermined time period of the chirp sequence is greater than or equal to 55 seconds.

The chirp frequency range is illustratively from about 10 Hz to about 120 Hz for an subwoofer embodiment. Illustratively, the chirp sequence is generated at 1 Hz intervals within the frequency range, and a sound level of the output of the loudspeaker is detected and stored at each 1 Hz interval of the chirp sequence.

In one illustrated embodiment, the step of modifying the output of the loudspeaker uses frequency equalization. In other embodiments, the step of modifying the output of the loudspeaker uses at least one of output delay, phase change, or other signal processing technique.

According to yet another illustrated embodiment, a method of improving sound quality of a loudspeaker in a room is provided. The method includes providing a reference frequency response signal indicating a desired frequency response for the loudspeaker, measuring a frequency response of an output of the loudspeaker in the room, matching the reference frequency response signal with the measured frequency response by aligning the reference frequency response signal with the measured frequency response in a low frequency range, comparing the measured frequency response in the room to the reference frequency response signal after the matching step, and modifying the output of the loudspeaker based on the results of the comparing step.

In an illustrated example, the low frequency range for matching the reference frequency response signal with the measured frequency response is about 15 to about 25 Hz. In one example, the matching step is based on aligning a slope of the reference frequency response signal with a slope of the measured frequency response in the low frequency range. In another example, the matching step is based on aligning sound pressure levels of the reference frequency response signal with sound pressure levels of the measured frequency response in the low frequency range.

In yet another illustrated embodiment, the method further includes determining whether a difference between wherein the measured frequency response in the room and the reference frequency response signal exceeds a predetermined level after the matching step. The method also includes re-matching the reference frequency response signal with the measured frequency response if the difference exceeds the predetermined level.

According to another illustrated embodiment, a loudspeaker includes a housing, a speaker located in the housing, a digital signal processor located in the housing, and a memory located in the housing. The memory is coupled to the digital signal processor. The loudspeaker also includes an amplifier coupled to the digital signal processor, a speaker driver coupled to the amplifier and to the speaker, and a demonstration audio file stored in the memory. The digital signal processor is programmed to selectively retrieve the demonstration audio file and play it through the speaker without connecting the loudspeaker to a separate piece of audio equipment.

An illustrated embodiment also includes means for updating the demonstration audio file stored in the memory. Illustratively, the demonstration audio file is optimized for capabilities of the loudspeaker.

In another illustrated embodiment, the loudspeaker includes a user input device on the housing. The user input device is used to instruct the digital signal processor to retrieve the demonstration audio file and play it through the speaker. In yet another illustrated embodiment, a display is located on the housing. The display is coupled to the digital signal processor.

According to still another illustrated embodiment, a method is provided for demonstrating a loudspeaker. The method includes providing a speaker, a digital signal processor, a memory coupled to the digital signal processor, an amplifier, and a speaker driver coupled to the speaker within a housing, storing a demonstration audio file in the memory located within the housing, and executing a demonstration mode wherein the demonstration audio file is retrieved by the digital signal processor and played through the speaker using the amplifier and speaker driver in the housing without connecting the loudspeaker to external audio equipment.

In an illustrated embodiment, the method further includes compressing the demonstration audio file stored in the memory and decompressing the demonstration audio file for playback during the demonstration mode.

According to a further illustrated embodiment, a loudspeaker includes a housing, a speaker located within the housing, a controller located in the housing for driving the speaker; and a sound pressure level (SPL) detector located in the housing to measure a SPL of an output of the speaker.

In an illustrated embodiment, a display is located on the housing. The loudspeaker also includes means for displaying the measured SPL level detected by the SPL detector on the display. Illustratively, the means for displaying the measured SPL level also displays a frequency output of the speaker corresponding to the SPL level on the display.

According to another illustrated embodiment, a method includes providing a loudspeaker having a digital signal processor for controlling operation of the loudspeaker and a memory coupled to the digital signal processor, storing a unique serial number for the loudspeaker in the memory of the loudspeaker, and selectively retrieving the unique serial number from the memory.

In an illustrated embodiment, the method includes storing information related to the loudspeaker corresponding to the unique serial number, and retrieving the stored information based on the serial number retrieved from the memory. Illustratively, the stored information related to the loudspeaker includes at least one of a model number, a revision number, a date of manufacture, and a sales channel.

Also illustratively, the unique serial number is stored in a sector of a non-volatile memory during production of the loudspeaker. The sector is illustratively locked in software to reduce the likelihood of any change being made to the unique serial number. The sector may also be locked in hardware and made tamper-proof.

In another embodiment, the method further includes coupling a diagnostic tool to the digital signal processor of the loudspeaker and retrieving the unique serial number stored in the memory to facilitate at least one of maintenance, a repair, a recall, and an upgrade of the loudspeaker.

According to yet another illustrated embodiment, a method of operating a loudspeaker includes providing a loudspeaker having a digital signal processor for controlling operation of the loudspeaker and a memory coupled to the digital signal processor, storing a model number of the loudspeaker in the memory, and storing software in the memory for controlling the a plurality of different model numbers of loudspeakers. The method also includes determining the model number of the loudspeaker from the memory, selecting portions of software stored in the memory for controlling the loudspeaker based on the determined model number, and using the selected portions of the software to control the loudspeaker.

In an illustrated embodiment, the method further comprising storing information related to the loudspeaker corresponding to the model number, and retrieving the stored information based on the model number retrieved from the memory. In an other illustrated embodiment, the software determines appropriate filters to use to equalize an output of the loudspeaker based on the determined model number.

According to a further illustrated embodiment, a method of improving sound quality of a plurality of loudspeakers in a room includes providing a reference frequency response signal indicating a desired frequency response, measuring a combined frequency response of outputs from the plurality of loudspeakers in the room, and comparing the combined measured frequency response in the room to the reference frequency response signal. The method also includes modifying an output of a first loudspeaker based on the results of the comparing step, and using a modified output of the first loudspeaker as an input to at least one other loudspeaker.

Additional features of the present invention will become apparent to those skilled in the art upon consideration of the following detailed description of illustrative embodiments exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

Figure 1:
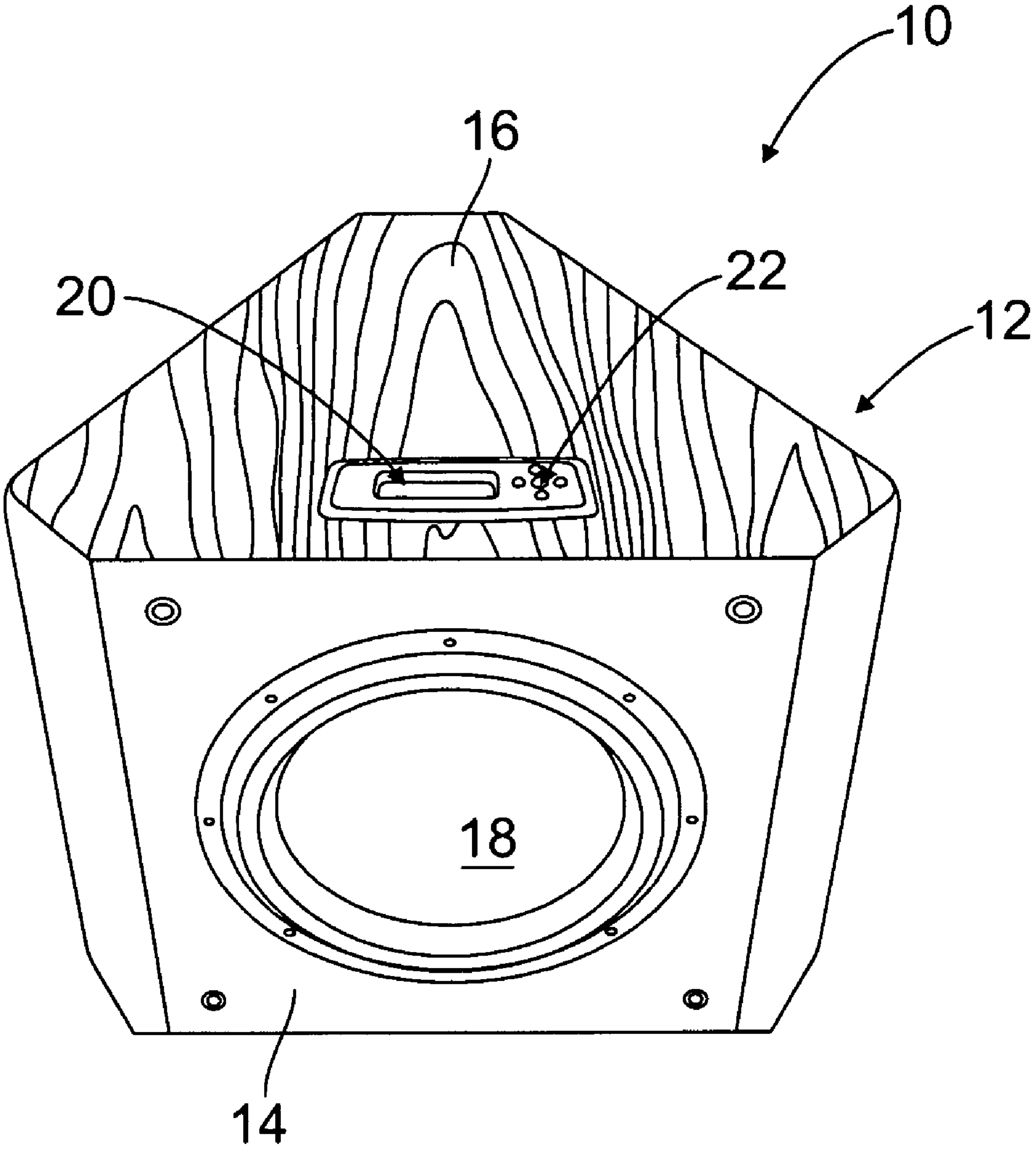
FIG. 1 is a perspective view illustrating a loudspeaker of an illustrated embodiment of the present invention.

Referring now to the drawings, FIG. 1 illustrates a loudspeaker 10 of the present invention. Illustratively, loudspeaker 10 is a subwoofer. It is understood that various aspects of the present invention may be used with different types of loudspeakers.

Loudspeaker 10 includes a housing 12 having a front panel 14 and a top panel 16. A speaker 18 is located in an opening in the front panel 14. A display 20 and a user input or interface 22 are located on top surface 16 of housing 12. Therefore, the display 20 and user interface 22 are easily accessible by an operator of the loudspeaker 10.

Figure 2:
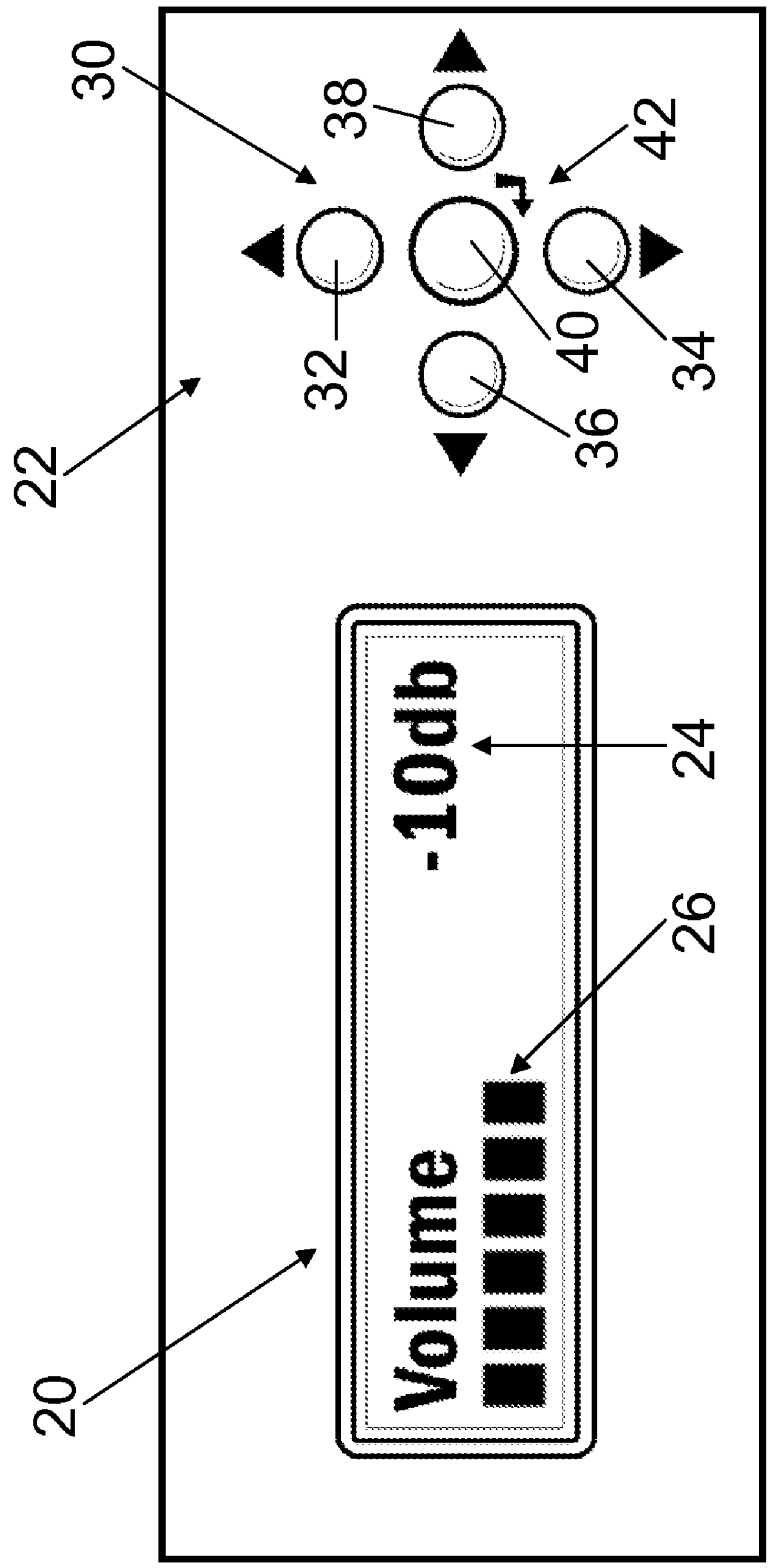
FIG. 2 illustrates a display and user control interface located on a loudspeaker housing.

FIG. 2 illustrates the display 20 and user interface 22 in more detail. In the illustrated embodiment, the display 20 displays a volume of the output from the loudspeaker 10 as indicated at location 24 during volume adjustment. A bar graph 26 also corresponds to the volume as discussed below. The display 20 also displays additional information for mode selection, calibrations, and settings.

The user interface 22 is illustratively used for control of the loudspeaker 10. For instance, the user interface 22 is used to change control settings which are accessed through a keypad 30 located next to the display 20 on the top surface 16 of housing 12. The keypad 30 illustratively includes an up key 32, a down key 34, a left key 36, and a right key 38. A center key 40 is also provided. In the illustrated embodiment, the up and down keys 32 and 34 are used to scroll through a list of control options which are presented on display 20. Once a particular control option is selected, the left and right keys 36 and 38 are used to make adjustments to a given control setting. The center key 40 includes an icon 42 which appears on display 20. Center key 40 is pressed to restore and recall custom settings or to lock the keypad 30.

Figure 3:
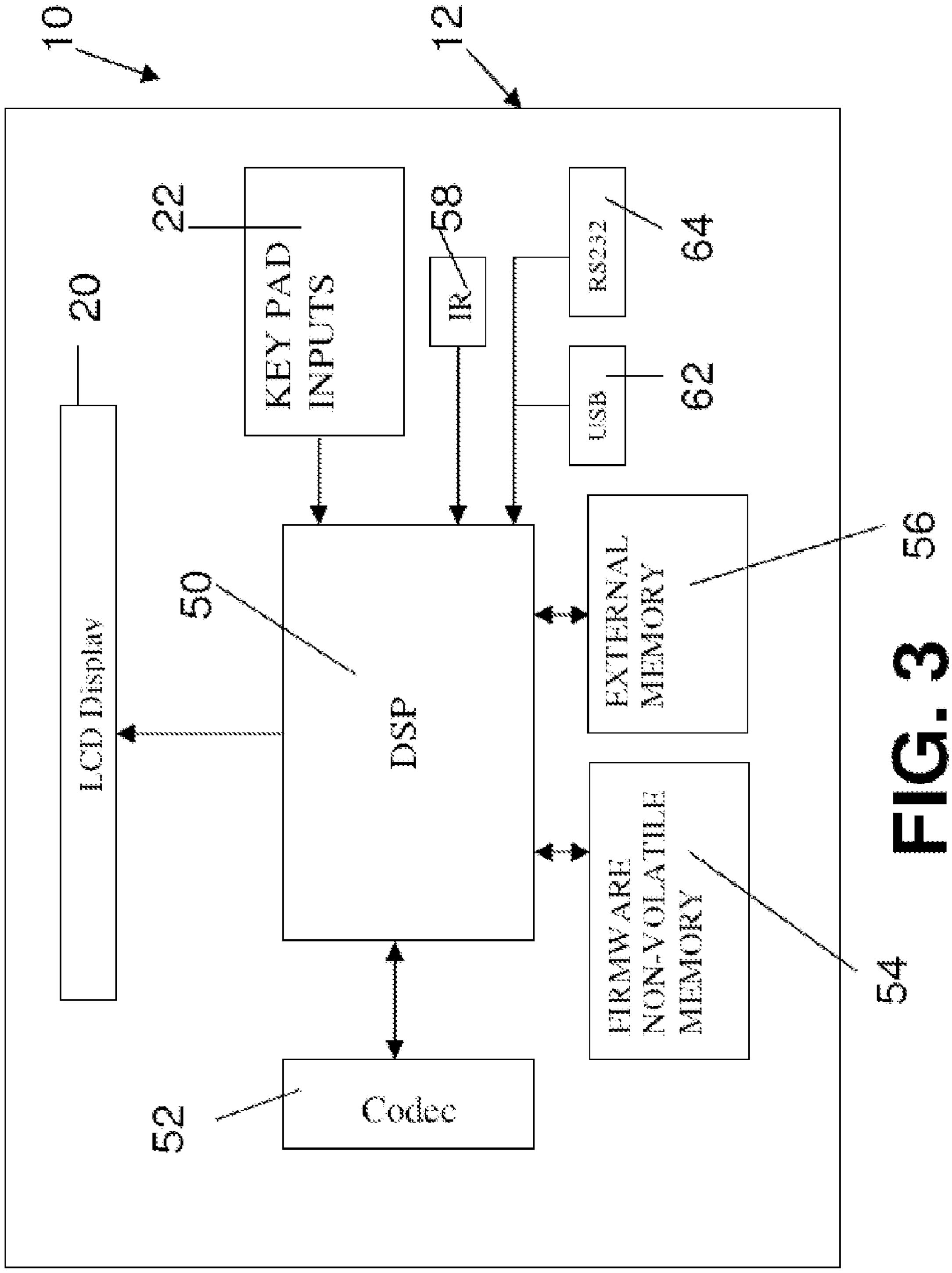
FIG. 3 is a block diagram illustrating a digital signal processor (DSP) and some of its component connections.

The present invention illustratively includes a digital signal processor (DSP) 50 shown in FIG. 3. The DSP 50 provides flexibility for performing mathematical functions on digital signals. The DSP 50 receives inputs from user interface 22 and provides an output to display 20 which is illustratively a LCD although other types of displays may be used in accordance with the present invention. DSP 50 is in communication with an audio CODEC 52 which compresses and decompresses digital audio data. DSP 50 is also coupled to firmware and non-volatile (flash) memory 54 and to random access memory 56. DSP 50 further receives signals from an IR sensor 58 so that the loudspeaker 10 may be controlled by a remote control 60. DSP 50 is also illustratively coupled to an USB chip 62 and a RS232 chip 64.

Figure 4:
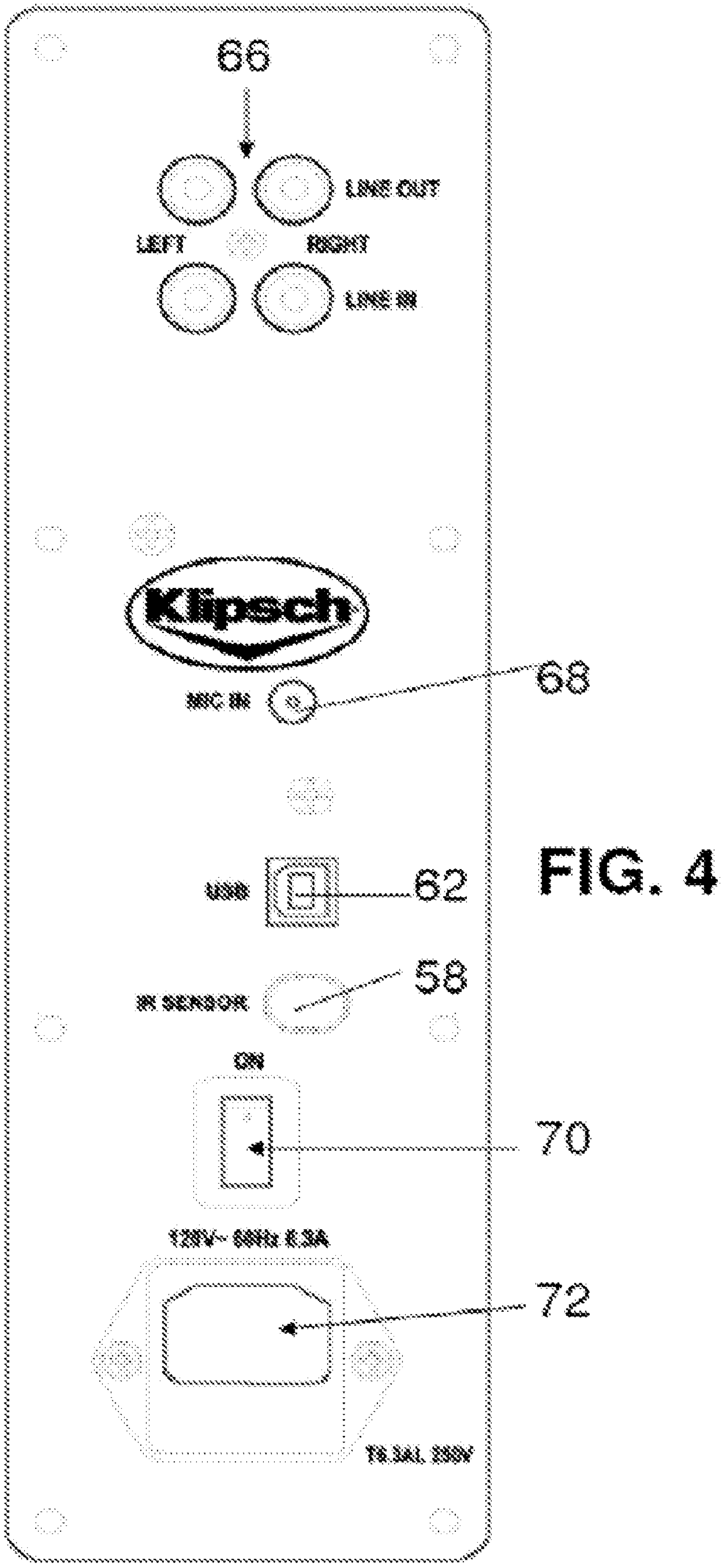
FIG. 4 illustrates a rear panel of an illustrative loudspeaker.

FIG. 4 illustrates a rear panel on the housing 12 of loudspeaker 10. Rear panel includes right and left line-in and line-out connectors 66, a microphone input 68, the USB port 63, the IR sensor 58, an "on/off" switch 70 and an AC power supply connector 72.

Performing all signal processing functions in the digital domain not only enhances the capability of the loudspeaker 10 but also allows extremely accurate control by the user and accurate feedback to the user via the display 20. Analog based subwoofers rely on potentiometers for most adjustments including crossover frequency, phase and volume. The tolerance of these potentiometers varies widely and the silkscreen labeling, the only visual cue to the user, is often inaccurate. Even digitally controlled subwoofers without accurate visual feedback can mislead the user in regards to settings. Often the user is not making the adjustment they intended. In the illustrated embodiment, the display 20 provides accurate visual feedback to the user. The interface is menu driven via only a small number of conveniently located controls on keypad 30.

Diagnostic Mode—Manufacturing Line Testing/Diagnostic

The hardware and software capabilities of the loudspeaker 10 permit testing of the system during manufacturing. The system program may include software designed solely for diagnostic testing. When placed into diagnostics mode the system runs self-checks and reports to the display 20 or a graphical user interface (GUI) of a connected PC of successful or unsuccessful tests of on board memory 54, 56 , communication with CODEC 52, audio signal path integrity, user interface buttons or keypad 30, user interface display 20, etc. This capability speeds testing, interfaces with a quality tracking system, and allows unskilled workers to conduct thorough testing.

Figure 5:
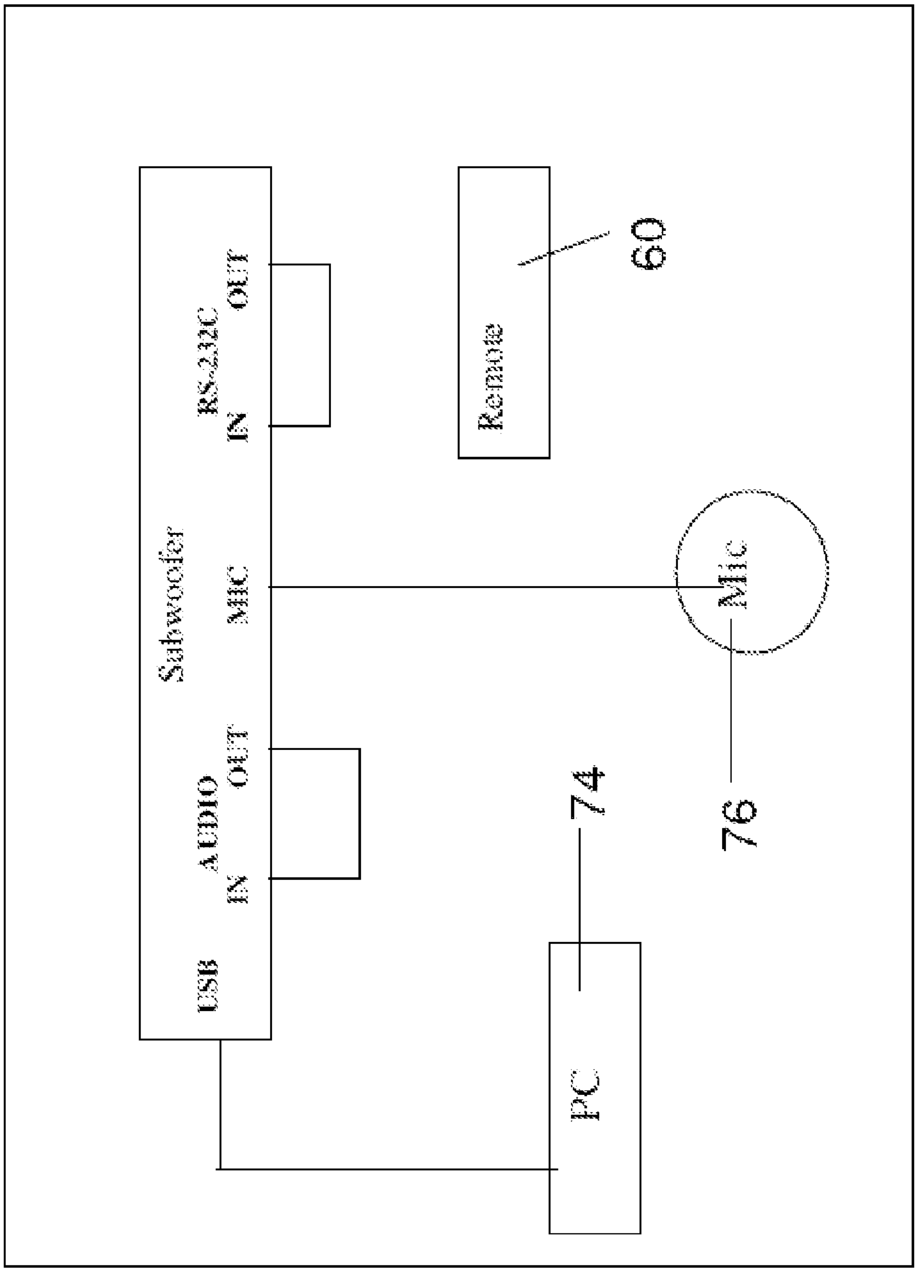
FIG. 5 is a block diagram illustrating a test set-up during a diagnostics operation.

FIG. 5 shows the set-up during a diagnostic mode of operation. The diagnostics set-up shows a loop-back from audio input to output and from RS-232C input to RS-232C output.

The diagnostics mode is illustratively entered by pressing and holding down two buttons on keypad 30 on the subwoofer 10 while the power is turned on at switch 70. A PC is connected via USB port 63 to determine whether the USB chip 62 works and to update a serial number for the loudspeaker stored in memory 54. A microphone 76 (or other suitable transducer) is coupled to microphone input 68. In the diagnostics mode, the subwoofer 10 goes through a number of tests including checking audio input and output, microphone input, RS-232 connectivity as well as DSP internal checks like RAM memory 56 and flash memory 54.

Figure 6:
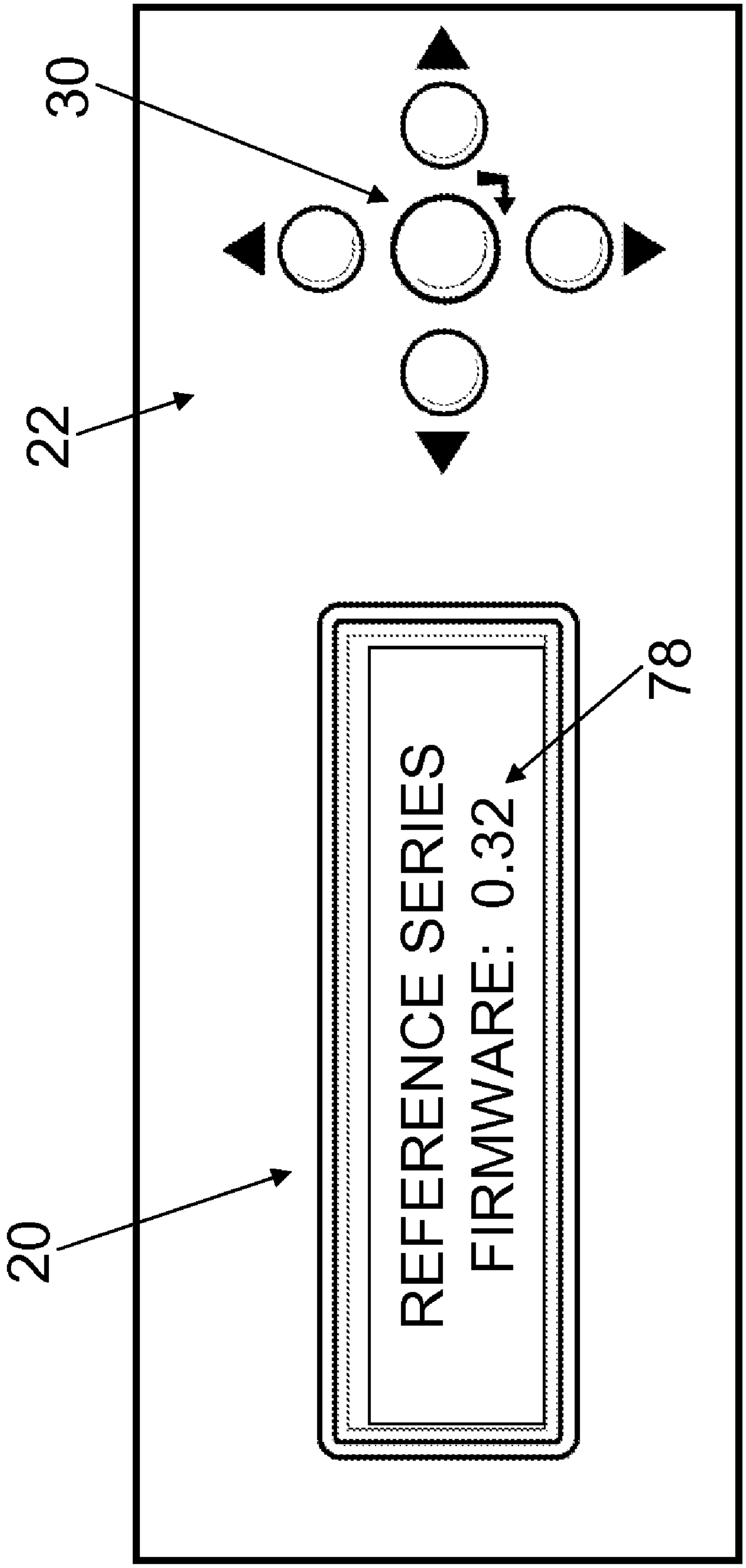
FIG. 6 is an illustrative display output during the diagnostics operation.

FIG. 6 illustrates an example display on display 20 during one of the steps of the diagnostics test. The version number for the firmware that is located in the subwoofer is reported first as illustrated at location 78 on display 20.

Model and Serial Number Stored in Memory

The non-volatile memory 54 of the system is used to store, among many other things, a model number and a serial number of the loudspeaker 10. This allows the hardware and software to be common among several different types or models of loudspeakers. Once the model number is stored, it can be retrieved from memory by DSP 50 or when the GUI of PC 74 is used to access the subwoofer 10 so that the GUI can determine the model of the loudspeaker 10 automatically without user input and potential error. Since the model number is programmed into memory, the DSP 50 may detect the model number and then select and use the appropriate software, filters, features and functions which are associated with that particular model. Storage of the serial number allows future tracking of revision, build date, sales channel, etc. While standard serial labels can and are removed by dealers and users, the serial number stored in memory 54 cannot be altered or erased. At production time, the serial number is written to the non-volatile memory 54 and stored in a sector. That sector may be locked in software to reduce the likelihood of any change of the serial number. This sector can also be locked in hardware and made tamper-proof.

At manufacturing time, a data base is created to associate each unique serial number with the model number, revision number and manufacturing date. Any other desired information related to the particular loudspeaker, such as sales channel or the like, may also be stored in the data base. Therefore, the system of the present invention provides an inventory control feature both in the plant prior to shipment of the loudspeaker and in the field at remote customer locations. A diagnostic tool may be coupled to the loudspeaker through a data link or communication network coupled to the DSP 50. The diagnostic tool can query the loudspeaker over the communication network to retrieve the unique serial number stored in the memory for warranty information maintenance, repairs, recalls, upgrades, or the like.

Demonstration Mode

The digital topology of the loudspeaker 10 allows for permanent and temporary storage of a great deal of information. The illustrated embodiment stores digitized music or sound for playback later. This is useful for supplying the chirp sequence needed for the subwoofer's auto equalization routines discussed below but may also be used to playback a selected portion of recorded audio material stored in the memory. Using the user interface 22, a stored audio recording is selected and played back through the system without the need for an external source or a connection to any other external audio equipment. The benefits of this demonstration mode include: the demo is controlled and is matched to the capabilities of the particular loudspeaker 10, the system doesn't have to be connected to other components which can be helpful in a retail sales setting where it's possible that not all loudspeakers are connected to a complete audio system, it can provide a sales floor advantage as being a unique and demonstrable feature. The total time available for demos is limited by the available memory 54, 56. Data compression can be used to reduce memory requirements and to extend this demo time.

GUI/PC Control

Figure 7:
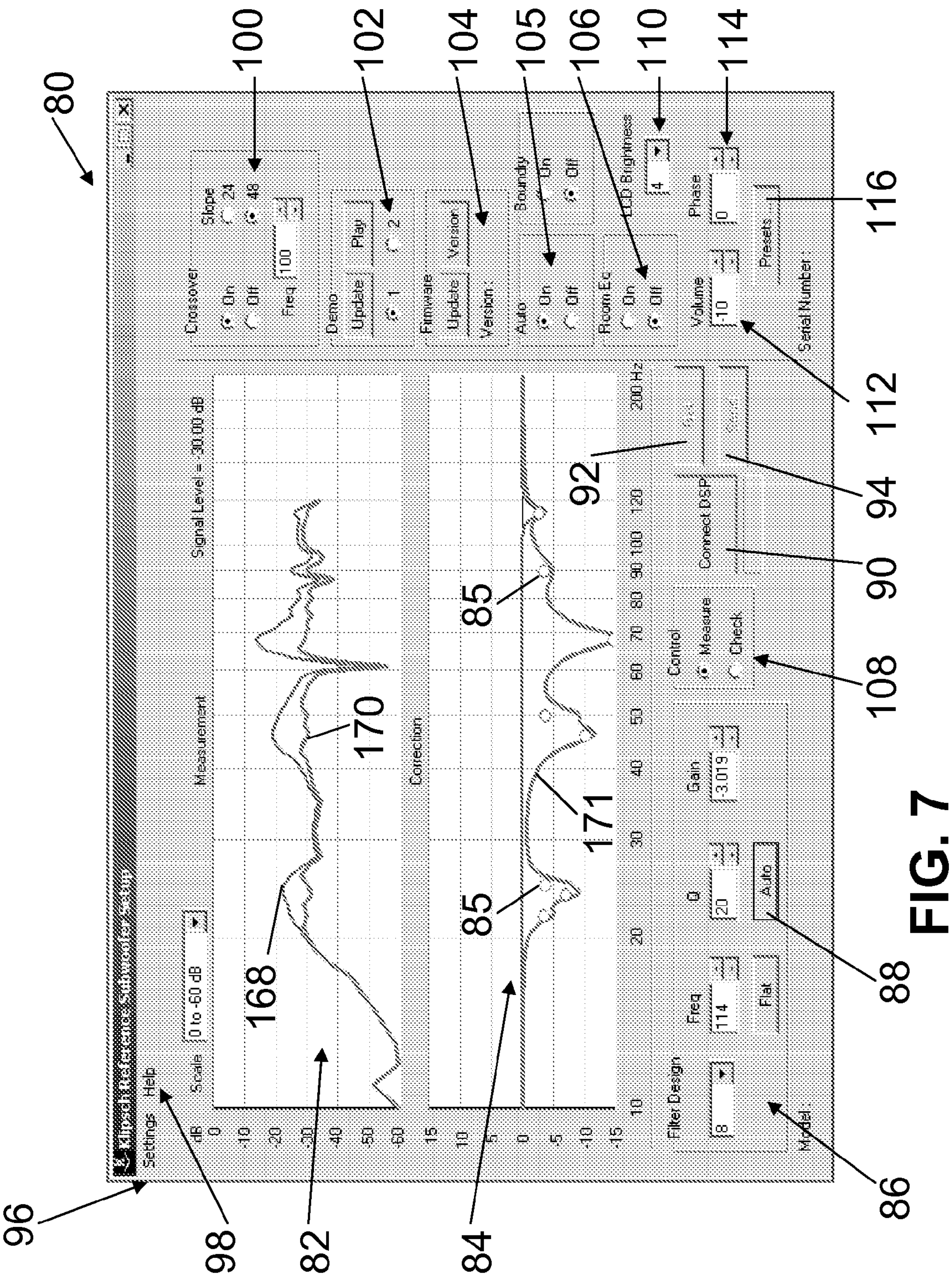
FIG. 7 is a screen shot illustrating a graphical user interface (GUI) on a personal computer (PC) used to control the loudspeaker.

A complex product like a loudspeaker 10 usually needs complex setup. However, a consumer usually prefers a simple setup. Both have been provided for in the illustrated embodiment. A PC GUI is provided for an installer or an advanced consumer, which can be used to setup the subwoofer 10. An illustrated example of the GUI 80 displayed on a PC 74 (or other suitable display) is shown in FIG. 7. GUI 80 allows aspects of the performance of loudspeaker 10 to be controlled or setup via the PC 74. The GUI 80 can be used both off-line i.e. disconnected from the loudspeaker 10 or while it is connected. Settings are saved to the PC 74 for later retrieval if the PC 74 is not connected to the loudspeaker 10.

Figure 8:
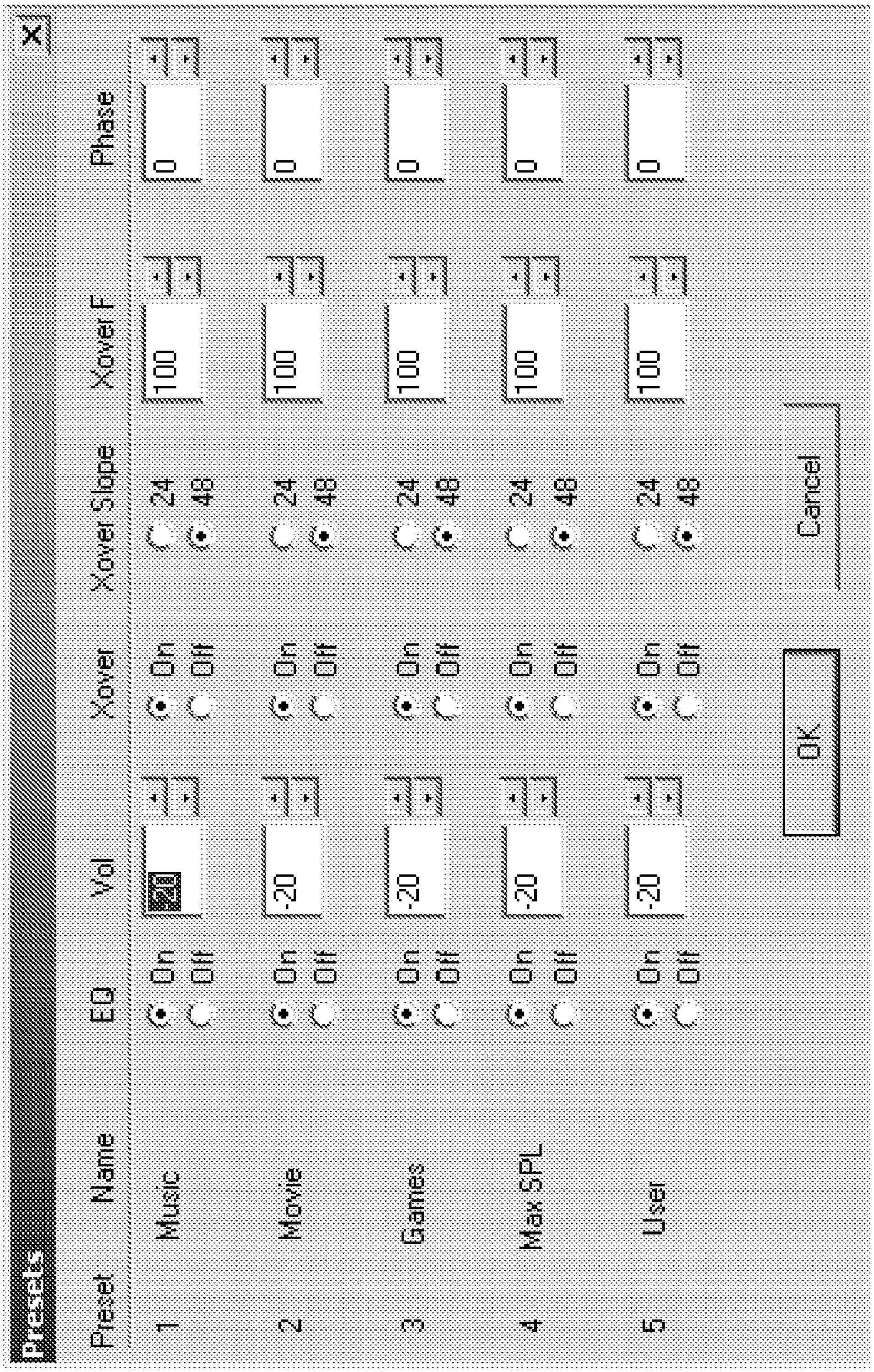
FIG. 8 is a screen shot illustrating a plurality of preset settings which may be adjusted using the GUI.

FIG. 8 illustrates a preset setup via the GUI. All presets can be downloaded or uploaded via the GUI 80. The presets are adjustable by an operator.

The GUI illustratively includes the following features:

a) Frequency curves for the measured room response and the corrected room-response are shown in graph 82, each of the individual correcting-filter responses and the sum of the correcting-filter responses are displayed location at display 84. The scale of the curves 82, 84 can also be changed to zoom into a specific region.

b) An automatic and manual filter design capability are controlled at box 86. If the correction filters are to be designed manually, Frequency (F), Q and Gain (G) are varied using the controls until desired room correction is achieved. The frequency and gain can be changed by dragging a filter icon 85 (illustratively a circle) to a new location while the left mouse button is kept pressed. For automatic mode, the auto button 88 is pressed and the filters are designed automatically. F, Q and G can be modified by an operator, if desired, after the automatic filter design is finished by adjusting the settings in box 86.

c) "Connect DSP" button 90 offers a convenient way to either work off-line or while connected to the DSP 50 for real-time changes.

d) When connected to the DSP 50, real time updates can be performed via get and send buttons 92, 94. The get button 92 retrieves all the appropriate information from the DSP 50. The send button 94 sends all the appropriate information to the DSP 50.

e) Settings menu 96 can be clicked to load and save settings to and from a file.

f) A help file is accessed by clicking button 98.

g) Crossover control is provided at region 100. The crossover can be varied from 40 Hz to 120 Hz. The slope can be either 18, 24, 36 or 48 dB/Oct (only slope settings 24 and 48 are illustrated). The crossover can also be turned off.

h) The demo play section allows the user to play and stop one of two stored demos in the illustrated embodiment. It is understood that more demo audio files may be provided. The update button brings up a dialog box that allows a demo to be loaded into the non-volatile memory 54 of the DSP 50.

i) Section 104 permits updates of the firmware.

j) The auto-on setting 105 allows the subwoofer 10 to turn on automatically if it senses an input signal. The auto-off setting means the subwoofer does not turn-on automatically but has to be turned on manually using switch 70.

k) Room-EQ can be turned on and off with setting 106.

l) "Measure" setting in control region 108 is selected to start the room calibration mode of operation.

m) Once the room calibration is done, it can be checked to see how well the room has been equalized by selecting the "Check" setting in control region 108. Calibrating the room again should produce a fairly flat frequency response.

n) LCD Brightness control 110 changes the brightness the LCD and a back LED.

o) Volume control 112 increases or decreases the signal level.

p) Phase control 114 changes the phase from any setting between 0 to 180°.

q) Modes (Flat, Music, Games Movie) can be stored as presets by clicking button 116. The name of the preset can be changed too. FIG. 8 illustrates details of adjustments to various presets.

Figure 9:
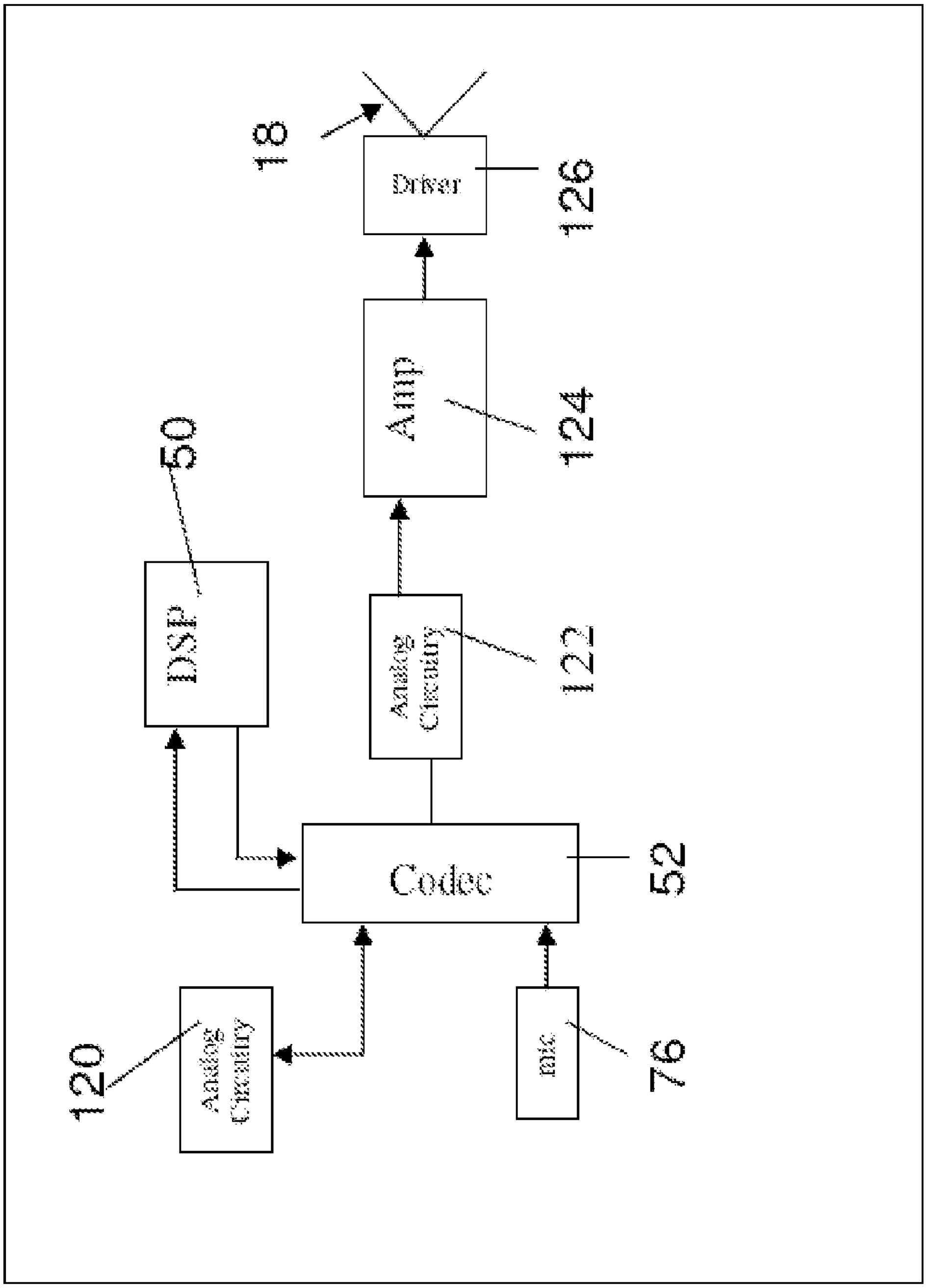
FIG. 9 is a block diagram illustrating an audio path for the loudspeaker.
Figure 11:
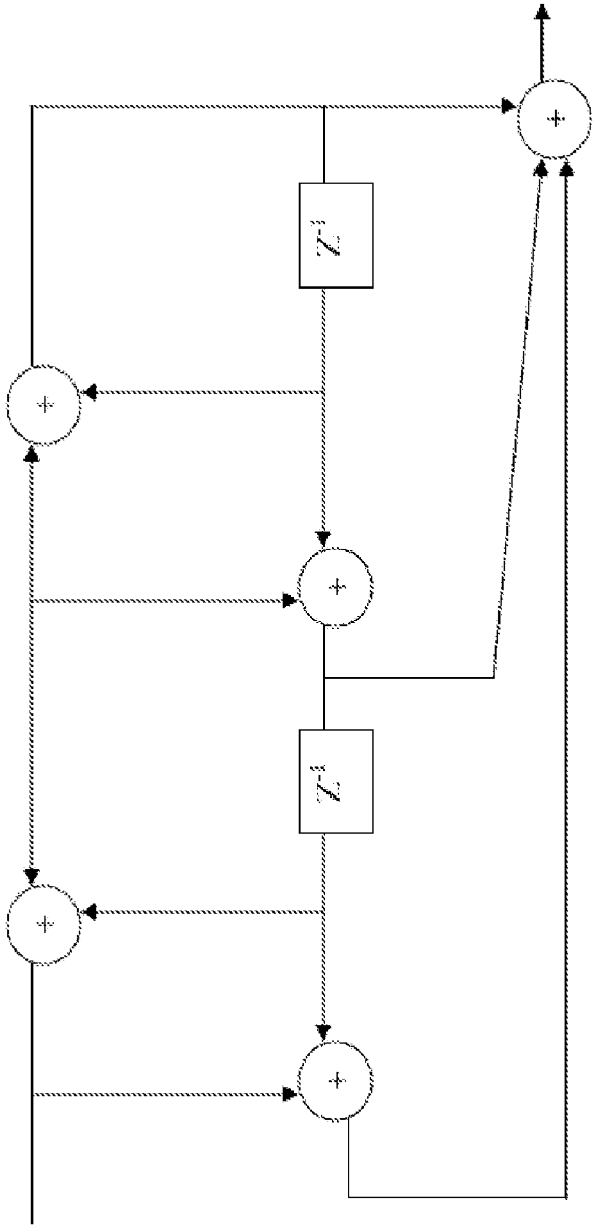
FIG. 11 is a block diagram illustrating a Gray and Markel $2^{nd}$ order filter structure.

As discussed above, the audio processing is based around a DSP 50 as shown in FIG. 3. An illustrative audio path is shown in FIG. 9. Audio comes in via a balanced XLR or unbalanced RCA and is fed after some analog conditioning by analog circuitry 120 to the A/D part of the CODEC 52. The DSP 50 takes this audio, processes it and then sends it back to the CODEC 52. The output of the CODEC 52 is fed after some analog conditioning by circuitry 122 to an amplifier 124. The amplifier 124 is connected to speaker driver 126 of speaker 18. DSP 50 illustratively processes the audio with a precision of 32 bits. Because the range of frequencies of interest (20 to 120 Hz) is so small compared to the sampling frequency of 8 kHz, high stability filters are used as shown in FIG. 11 and in reference [1] listed above to provide very high S/N ratio and stability. The D/A part of the CODEC 52 then converts the digital signal to an analog signal.

Figure 10:
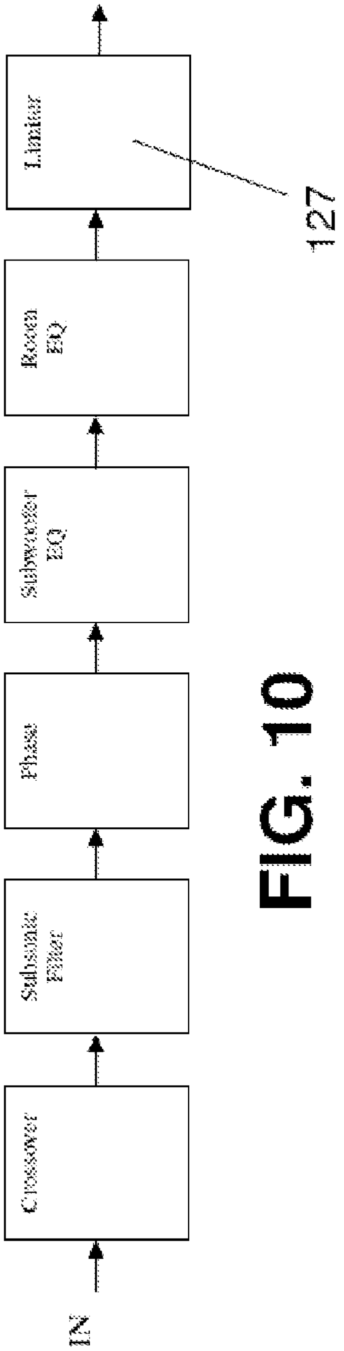
FIG. 10 is a block diagram illustrating a signal processing chain.

FIG. 10 illustrates a fully digital signal processing chain. The audio processing is carried out to a high precision of 32 bits inside the DSP 50.

FIG. 11 illustrates a Gray and Markel $2^{nd}$ order filter structure used to provide stability of the IIR filters and stop any limit cycles from occurring due to the fixed-point DSP 50 used.

Room Measurement and Calibration

A room measurement, if done accurately, will often show a large number of peaks and valleys or dips in the frequency response. Visually inspecting a plot of the sound magnitude vs. frequency might suggest where the room modes are, but you can never be certain. If a bad guess is made at what the room modes are, an operator might successfully flatten the low frequency response, but will also reduce the efficiency and power output of the subwoofer 10. A bad guess that sets a reference level too high will miss the room modes and will not be able to flatten the frequency response of the room.

Figure 12:
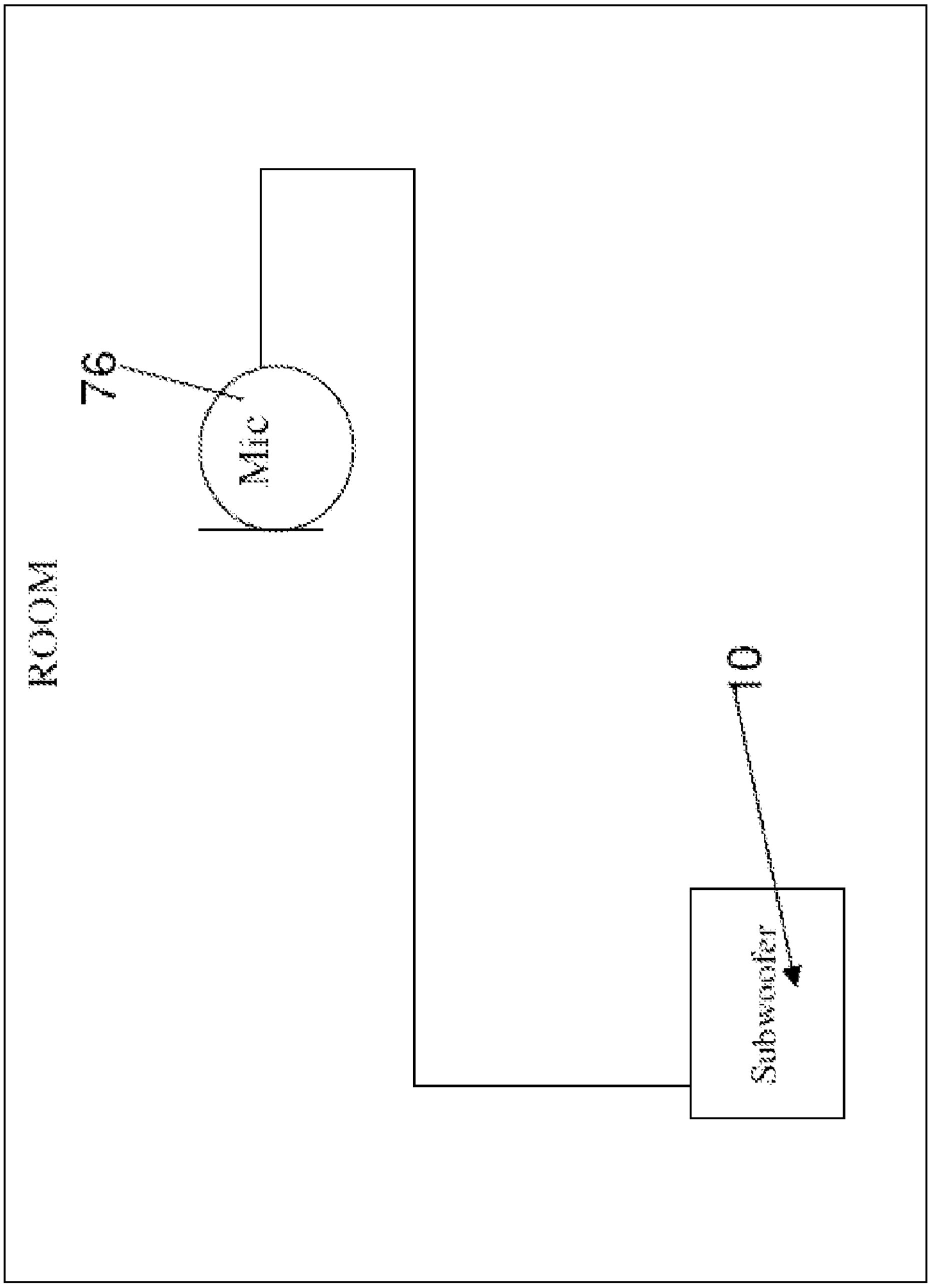
FIG. 12 is a block diagram illustrating a setup during an in-room calibration operation.

FIG. 12 illustrates the system in a room during calibration. No separate PC is needed to carry out room calibration. A microphone 76 (or other suitable transducer) is attached to the subwoofer 10 and the calibration started with the touch of a button on keypad 30. The frequency response that a person hears from a subwoofer is not only dependent on the subwoofer but also the position of the listener, the room, and the position the subwoofer is placed in that room. In order to provide a flat frequency response and good clean bass in a room, the subwoofer is calibrated in the room in which it will be used. The subwoofer may be calibrated as follows:

1. Attach the given microphone 76 and place it at the listener position.
2. Either using the GUI of PC 74 or the buttons on keypad 30, start calibration.
3. Wait 55 seconds for the calibration to finish.

Figure 13:
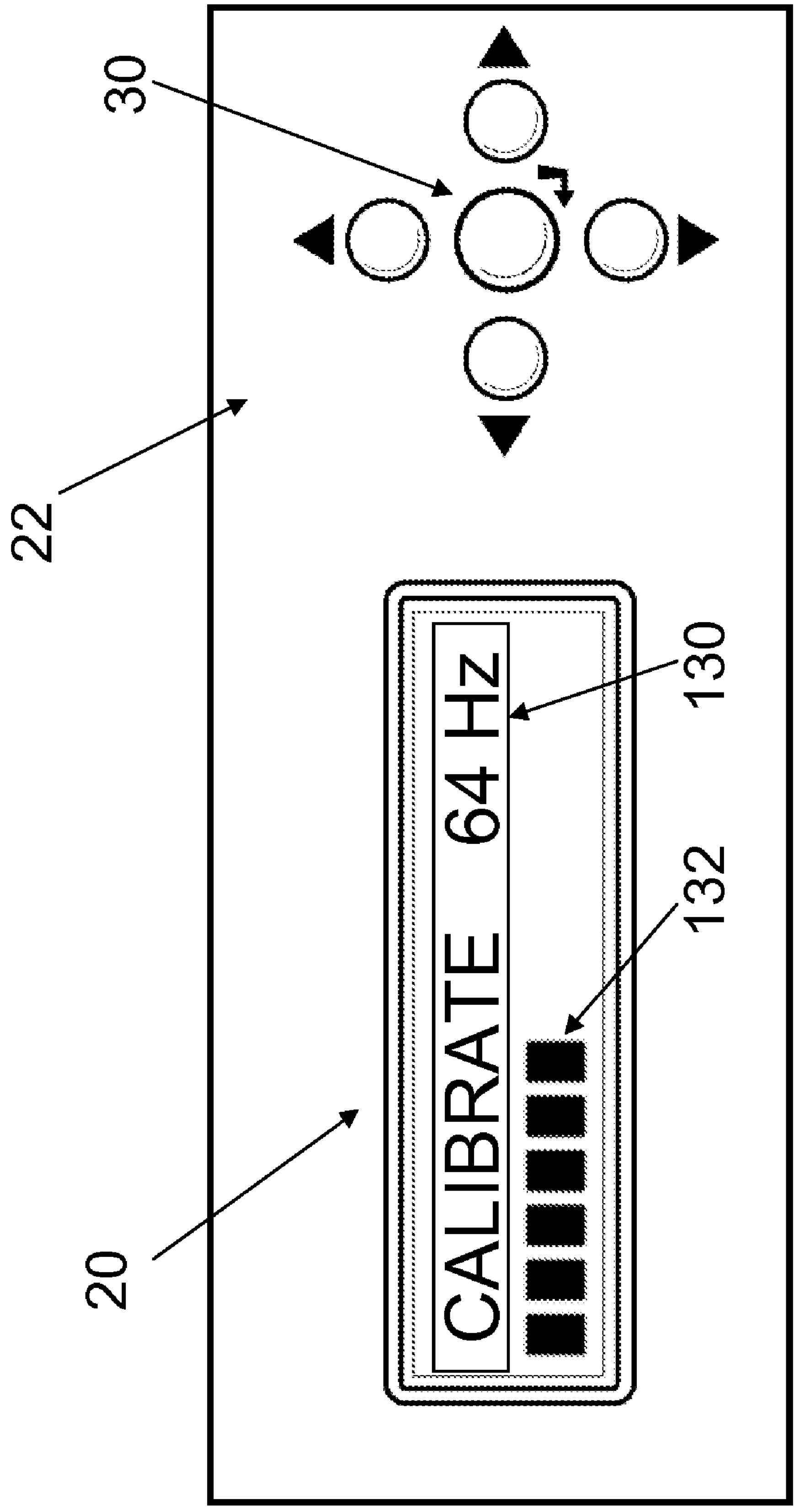
FIG. 13 is an illustrative display output during the calibration operation.

FIG. 13 illustrates the display 20 during calibration. While the subwoofer is measuring the room frequency response, the display 20 illustratively gives a continuous display of the current measurement frequency at location 130 as well as the measured SPL level at location 132. The SPL level is illustratively shown as a bar graph, but may be in any desired format.

Once calibration is done, the advanced user or installer may use the GUI to further modify the filters, if desired. The microphone 76 can also be moved to multiple positions to average out the response, if desired.

Auto EQ

Once the room has been measured a number of solutions exist to convert this to filters. This problem is a non-linear one and an iterative approach makes the best sense. The simplest approach is for a user to hand-tune filters until the desired correction filter is achieved. Unfortunately, this approach is cumbersome and prone to errors. An automatic filtering method of the present invention is much more useful.

Advanced Limiter

A limiter 127 is used to both protect the driver 126 and the amplifier 124 in the subwoofer 10. The driver 126 can destroy itself by thermal or mechanical overload. This subwoofer is calibrated such that the limiter 127 stops excessive cone movement. The temperature of the voice coil is also monitored. The limiter 127 is also calibrated to limit the subwoofer from going to excessive acoustic distortion.

Multiple Subwoofers

Typically, in a room with multiple subwoofers, the subwoofers 10, 210, 310, 410 will be placed in the corners of the room (to excite the room to the fullest) if possible. A more favorable position, if possible, could be against the walls in front and behind the listening position . The directly in front and behind walls is an interesting position because at first look the subwoofers are equidistant from the listener so no time delays are involved but a closer look shows the advantage of using time delays to reduce room modes. As room modes are caused by the opposite wall being there, a signal sent from a subwoofer placed at this wall, with the correct delay, phase and gain setting will cancel out the reflection. This arrangement will work well if the room is rectangular and long, but a square room would require four speakers rather than two. Not all frequencies will be equalized by the use of two subwoofers placed as described, so further room equalization will be needed.

In a lot of cases, people may buy a new subwoofer to replace an older model. Subwoofer 10 has a line out that can be used to connect a non room-correcting subwoofer. The subwoofer 10 of the present invention auto-calibrates not only itself but also any number of subwoofers connected to it via the line-out, i.e. the line-out is also processed by the DSP 50. The PC GUI can be set up to handle any scenarios such as two subwoofers on the walls in front and behind the listener as a special case for improved room correction capability.

Multiple subwoofers in a room not only produce a louder low frequency signal they can excite more room modes. As the subwoofers have to occupy different physical positions in a room, each excites different room modes. At certain frequencies, the room modes may be close together for each subwoofer and this lowers the Q of the room. At other frequencies, the room modes might just increase. The system of the present invention tunes each subwoofer to remove its room-modes. The subwoofers can then be daisy chained to pass volume changes and other settings change to all other subwoofers. One subwoofer is typically set up as a master.

Figure 14:
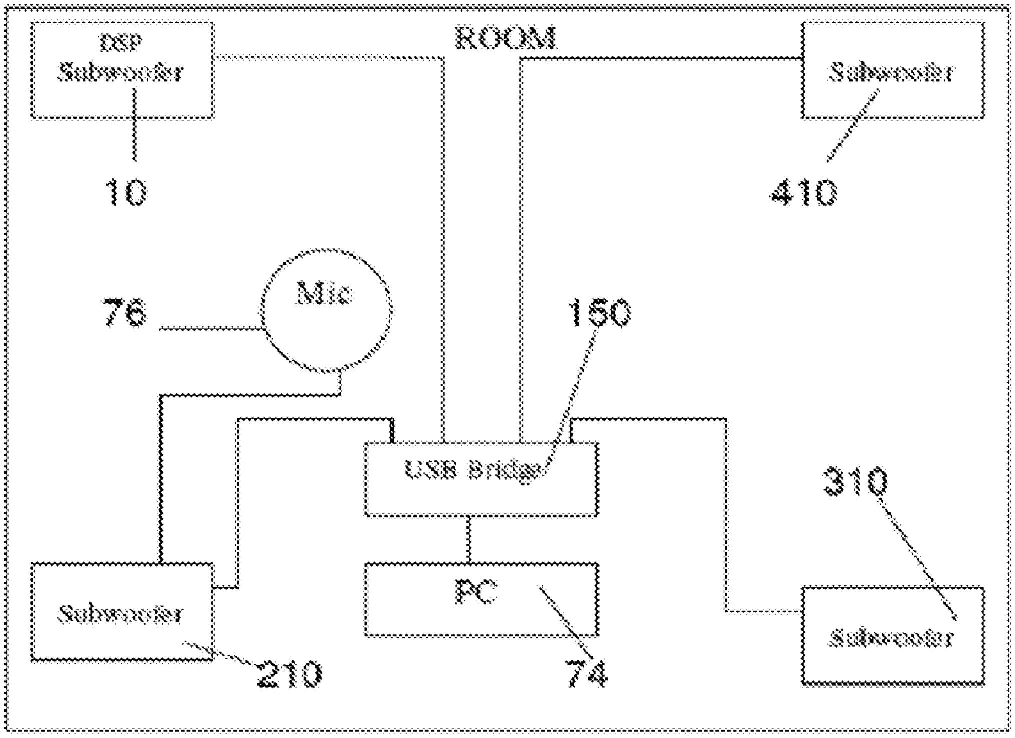
FIG. 14 is a block diagram illustrating multiple subwoofers in room during a calibration operation.
Figure 15:
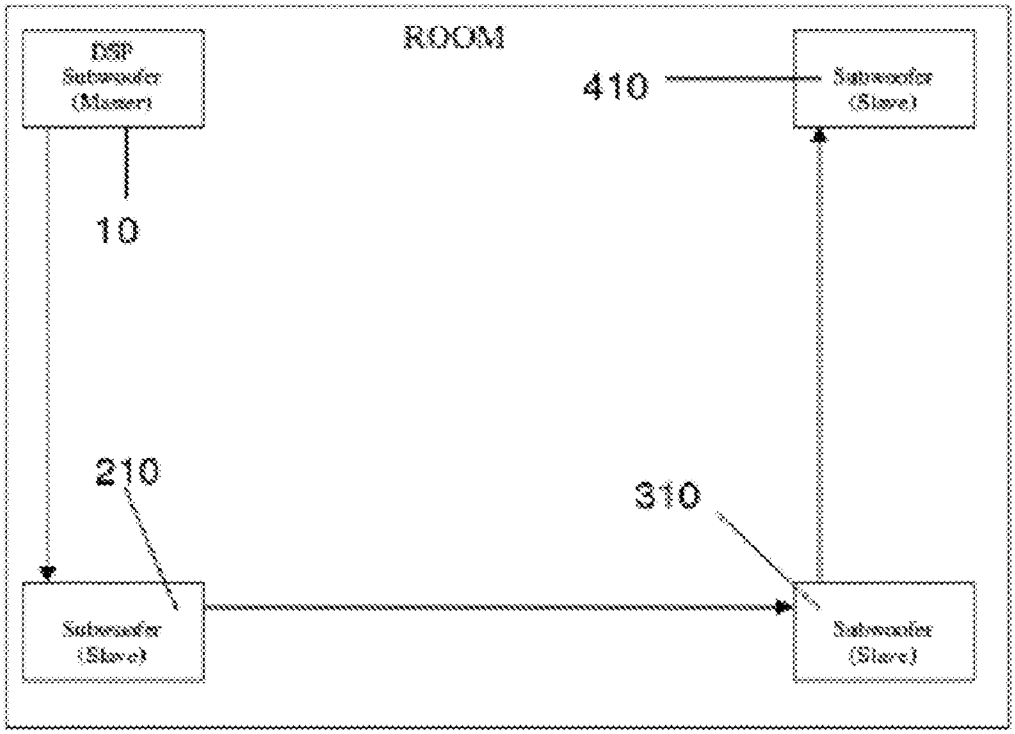
FIG. 15 is a block diagram illustrating multiple subwoofers during use with one subwoofer set-up to be a master and the other subwoofers as slaves.

FIG. 14 shows four subwoofers 10, 210, 310, 410 in a room, connected via a USB bridge hub 150 to a PC 74 during calibration. The subwoofers 10, 210, 310, 410 can also all be connected to each other via line in/line out connections or RS-232 ports after the calibration is done as shown in FIG. 15. One of the subwoofers 10 is then a master and sends commands to the other subwoofers 210, 310, 410 in the chain.

When using multiple subwoofers, either each subwoofer may be calibrated individually or a PC may be attached for better results. The microphone 76 (or other suitable transducer) may be attached to each subwoofer in turn. The PC software may then do a joint room equalization using all the subwoofers 10, 210, 310, 410 into account.

FIG. 15 illustrates multiple subwoofers during use with one subwoofer 10 set-up to be the master. Once the multiple subwoofers have been set-up, one subwoofer 10 is made the master so that it sends important and necessary information like volume changes to all the slave subwoofers 210, 310, 410.

Speakers used in music or movie reproduction at home have evolved from mono to stereo to 5.1 and to 7.1. It is only a matter of time before a 10.2 or other standard is finalized. Some people are already using multiple subwoofers in their system for increased volume and better sound. The potential improvement in sound quality when using multiple subwoofers that have been jointly room equalized is very high. The present invention provides software which will equalize multiple subwoofers.

In an illustrated embodiment using the multiple subwoofers, subwoofers 10, 210, 310, 410 are first connected to USB bridge 150 as shown in FIG. 14. If all of the subwoofers, 10, 210, 310, 410 include a DSP 50 as discussed herein, a microphone 76 may be connected to any of the subwoofers 10, 210, 310, 410 to measure a combined frequency response of the subwoofers 10, 210, 310, 410 in the room. Modifications to an output signal of subwoofer 10 are then made based on the combined measured frequency response. Such modifications are made using frequency modulation, selected delays, phase changes, or other signal processing techniques as disclosed herein by only master subwoofer 10. The equalization features of subwoofers 210, 310 and 410 are disabled when the multiple subwoofers are connected together as shown in FIG. 15. Master subwoofer 10 may have a plurality of line out connectors connected individually to slave subwoofers 210, 310, 410, if desired. As discussed above, an output signal from master subwoofer 10 is processed by DSP 50 as discussed herein. The line out connections to subwoofers 210, 310, 410 is also processed. For instance, the output can be modified using frequency equalization as discussed herein. In addition, output signals to subwoofers 210, 310, 410 may be delayed to compensate for placement of the speakers in the room. The phase of the output signal delivered to subwoofers 210, 310, 410 may also be changed. As discussed above, the master subwoofer 10 with DSP 50 may be used with conventional subwoofers without a DSP 50.

Remote Control

A remote control 60 offers changing settings on the subwoofer 10 from the comfort of the listener's sofa. Settings like volume, phase, crossover frequency and modes may be set by a remote 60.

Figure 16:
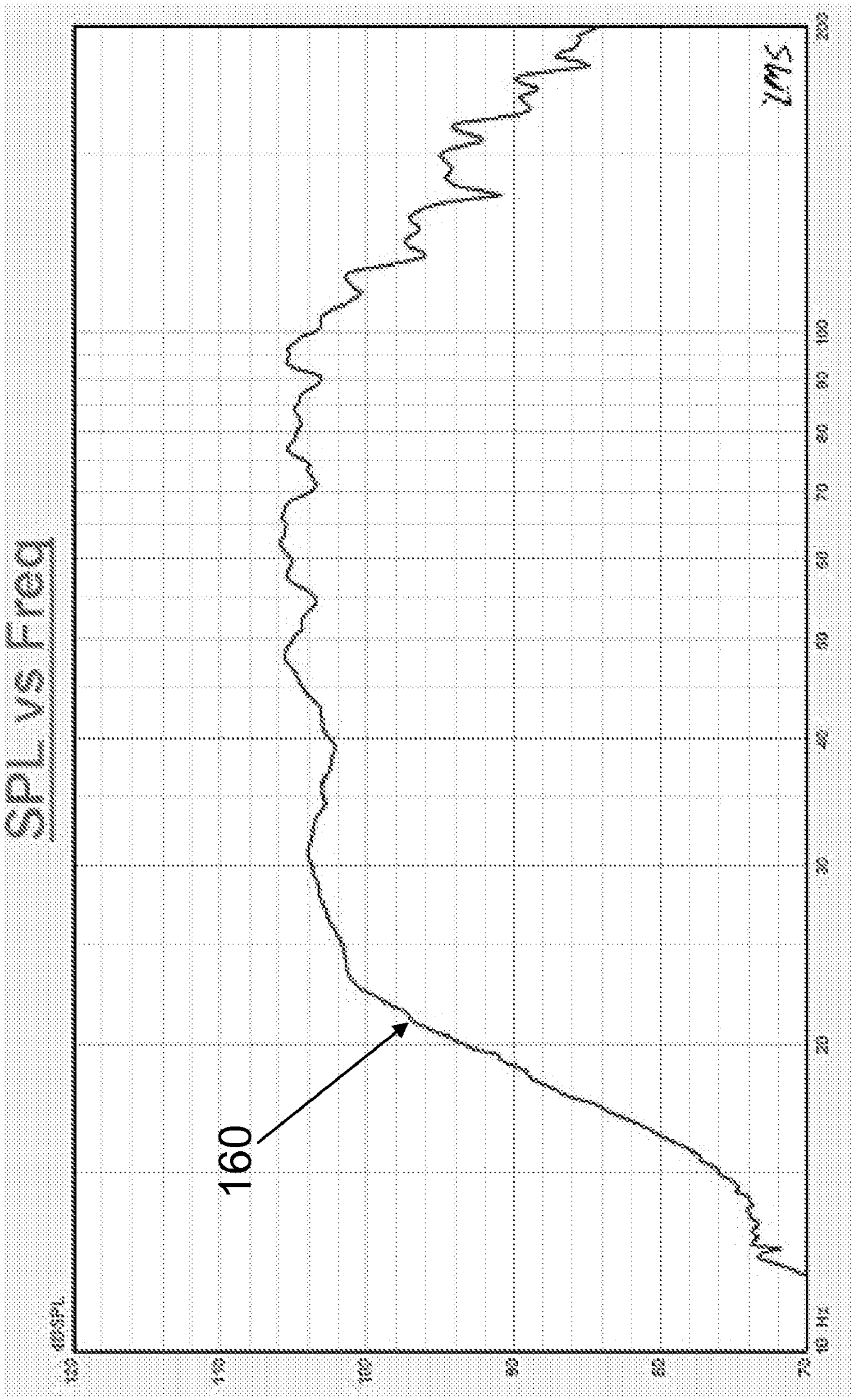
FIG. 16 is a graph illustrating a ground plane or reference frequency response signal providing an example of a desired frequency response of a subwoofer.

FIG. 16 is a graph illustrating a ground plane or reference frequency response measurement of a subwoofer 10 taken outside, away from walls and buildings. It represents the true anechoic response of the subwoofer 10. FIG. 16 shows a response curve 16 measured at a distance of 1 m from a subwoofer 10 placed in a ½ space. In ½ spaces the subwoofer is placed in a field far away from any buildings. The frequency response is fairly flat, as no room modes are present to modify the response and cause large peaks and dips. The slight dip at 35 Hz in FIG. 16 is due to not being able to get far enough away from a nearby building and usually this would not be present.

Either ⅛ or ½ space is typically used as a reference signal when equalizing the subwoofer 10. In a real room, if the subwoofer 10 is close to a corner, its response at the lowest frequencies (boundary gain) will follow the ⅛ space curve. If the subwoofer is placed in a room, well away from the walls (highly unlikely) then its response at the lowest frequencies will be close to the ½ space curve. This means there is a simple relationship between ⅛ space and ½ space. The only difference being more gain (6 dB more) for ⅛ space, which occurs at a lower frequency.

Filter Design

Once a frequency response has been determined, a number of solutions exist to convert this into filters. Because the frequency of interest is so low, FIR filters are not desirable because the filter length is too long. IIR filters are ideally suited to notch out narrow bands of energy. The problem of filter design is a non-linear one and an iterative approach is most appropriate. The simplest approach would be for a user to hand-tune filters until the desired correction filter is achieved. Unfortunately this approach is cumbersome and prone to errors. An automatic method of filtering is provided that is much more useful than hand turning.

To measure the room standing waves or room modes, a DSP based subwoofer is put in a room and a microphone 76 (or other suitable transducer) is connected to it as shown in FIG. 12. Selecting the calibration mode using the keypad 30 starts the measurement. This initiates a chirp sequence of approximately 55.5 seconds. The chirp start frequency is illustratively 10 Hz and the finish frequency is illustratively 120 Hz. A subwoofer's typical operational frequency range is between 20 Hz and 120 Hz. Therefore, the chirp is broad enough to measure all the standing waves that the subwoofer can create.

Chirp Length

The illustrated embodiment of the present invention uses a long chirp length for better signal to noise ratio. There are a number of methods to measure the frequency response of a room:

a) Stepped sine waves (discrete)
b) Chirp (log and linear)
c) MLS
d) White Noise
e) Pink noise
f) Impulse Each has its advantages and disadvantages. All the methods will produce the same result if each excitation is long enough and is made in the absence of noise and the system is linear. However measurements in a room are always made in a noisy environment. The High-Q of the room also dictates the need for a long excitation to adequately resolve the room.

The S/N ratio for a stepped sine wave is probably the best as all the energy is concentrated at a single frequency. The crest factor for a stepped sine is also very good at −3 dB. Speaker distortion does not play a part in the measurement as the distortion can easily be filtered out. The only drawback is the time needed to take the measurement.

The next best method is a chirp. As the frequency range of interest is so small 10 Hz to 200 Hz) a log or linear chirp are essentially the same. To achieve a good S/N ratio and hence an accurate measurement a long chirp period is required or some type of averaging of shorter chirps can be used. An averaging of a few chirps does present a problem of room-decay, as enough time must be given between chirps for the energy in the room to decay away from one chirp before starting the next. Any disturbances in a room (like an A/C unit) are spread out and have less effect for longer chirps. Shorter chirps will produce a smoothed frequency response. The S/N ratio for a chirp is directly proportional to the length of the chirp. A 48 second chirp would produce a 12 dB improvement in S/N ratio compared to a 3 second long chirp. In a room where we are looking for 0.5 dB gain differences and which has low amounts of background noise, the long chirp allows us to take measurements at a lower signal level to reduce subwoofer distortion and get more accurate results. To measure to an accuracy of 0.1 dB typically requires a S/N ratio of 40 dB. A 90 dB SPL output from a subwoofer has an energy of 90-10.0 log 10(1/200)=67 dB per Hertz assuming a chirp which starts a 20 Hz and ends at 220 Hz. So coupled a noise floor of 50 dB, an output of 115 dB is needed from the subwoofer to measure to 0.1 dB accuracy. This clearly is in a non-linear region of the driver and the only way to measure accurately is to measure for a longer time.

As discussed above, the chirp sequence is generated over a predetermined frequency range for a predetermined time period. Illustratively, the frequency range is 10 Hz to 120 Hz. The resolution of measurement is illustratively 1 Hz. In other words, the chirps are generated at 1 Hz intervals between 10 Hz and 120 Hz. Each frequency chirp lasts for a time interval of 0.5 second. Therefore, in an illustrated embodiment, the chirp sequence lasts 55.5 seconds.

While the chirp is being generated, the signal the microphone 76 detects is sent thru a peak-detector and a smoother. This detector records the peak level of the sound being generated in the room. The output of the peak detector is saved every 0.5 second along with the corresponding frequency being generated by the subwoofer. Once the measurement is finished, there are 121 measurements of the peak detector that are stored in memory. It is understood that other frequency ranges, time periods and resolution levels may be used for the chirp sequence. In one embodiment, the time period of the chirp sequence is any time period greater than 10 seconds. In another embodiment, the time period of the chirp sequence is any time period greater than or equal to 48 seconds.

The peak detector measurements are then converted to sound-pressure levels (SPL) by the following formula (note SPL can be calculated because we have a calibrated microphone):

$$SPL=20.0\ \log_{10}(peakLevel)$$

The measured SPL of the room is then matched to a stored reference frequency response of the ground plane measurement of the same subwoofer that is stored in memory and illustrated by the graph of FIG. 16.

It is understood that the room measurements to obtain the measured frequency response in the room may be taken at a plurality of different locations by moving the microphone and re-running the measurement discussed above. The multiple measurements may then be averaged or otherwise combined to produce a combined measured frequency response for the room. The combined measured frequency response may account for differing frequency responses at different locations. The combined measured frequency response takes into account time delays and phase differences that occur as the microphone 76 is moved to different locations.

Before comparing the reference frequency response signal to the measured frequency response, matching of the two signals is done at the lowest frequencies. The boundary gain due to the room is equal at these frequencies. The matching may be as simple as making sure the gains at a particular frequency are the same, or an actual estimate of the slope of the two curves may be used with a least squares approach to minimize the error.

Once the levels or slopes of the measured signal and the reference signal are matched, the difference is taken between the two measurements. This represents the total room gain of the system and establishes the target curve. Only the peaks above the target curve are corrected. The reason to remove the peaks are many fold including:

a) peaks sound worse than dips or valleys.
b) if dips are removed, by boosting the signal, it will reduce the headroom of the system and use up more amplifier power.
c) removing dips and boosting the signal may well show up as even bigger boost in another part of the room.

Figure 27:
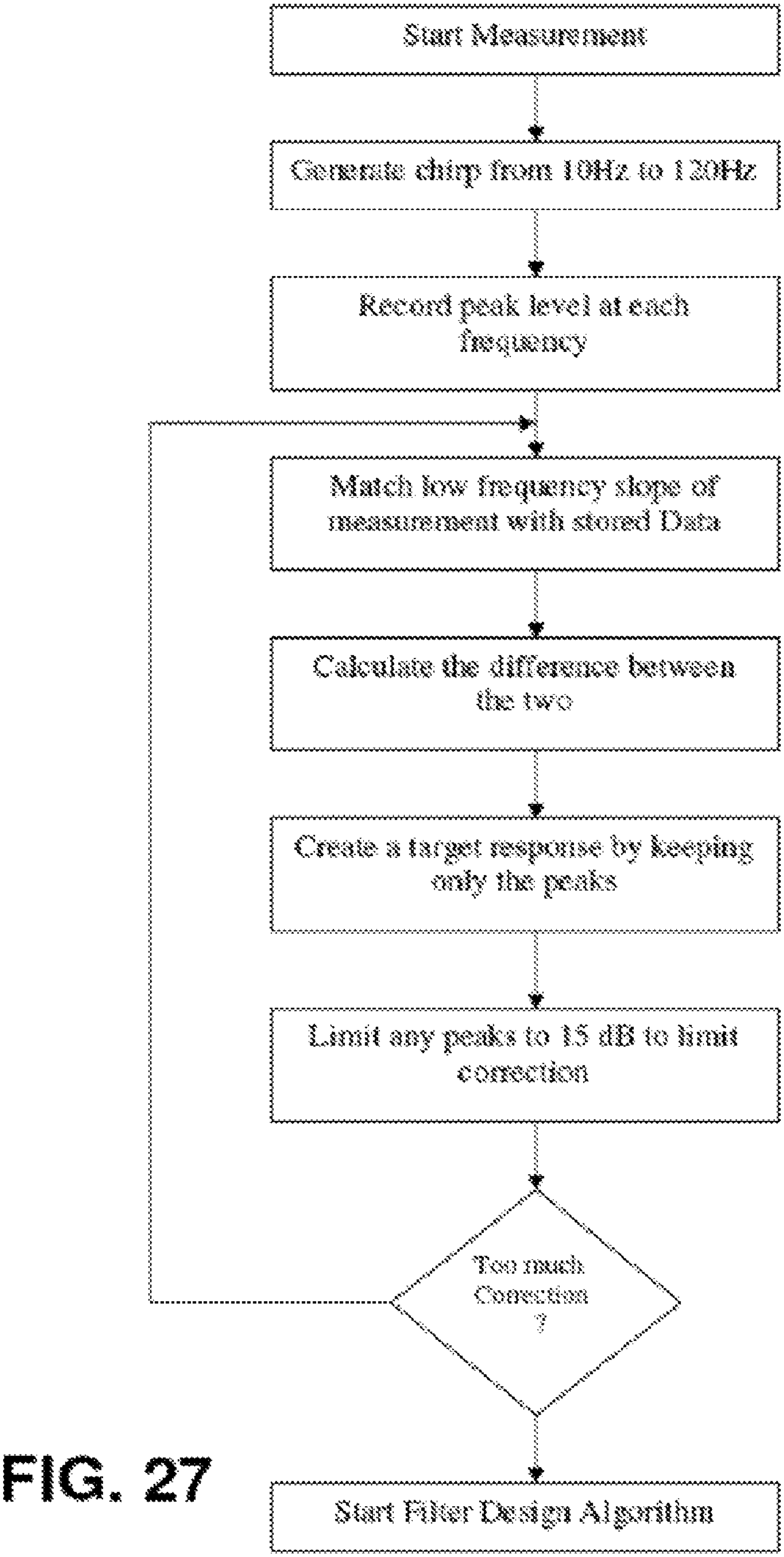
FIG. 27 is a flow chart illustrating a room measurement and filter design procedure.

As discussed herein, peaks in the measured frequency response above the reference frequency signal are detected. If peaks exist which are over 15 dB, then the system will overcorrect so limit the peaks to 15 dB as shown in FIG. 27. Once the peaks are limited to 15 dB, the systems checks again to see if the target will cause too much correction. This looks at the power loss after correction. The system only cuts the power and doesn't boost so power is removed from the room. A very low Q could mean too much reduction across a wide band of interest, so if this is true the system will rematch the slopes of the reference frequency response signal to the measurement frequency response but now using a higher frequency.

After the peaks are detected, the next step is to run the filter design algorithm. The filter design algorithm starts by looking for the highest peak and bandwidth combination. Once this is found, three parameters are needed to design a filter, Frequency (F), Q and gain (G). The frequency of a correction filter is clearly the frequency of the peak, the gain is the negative of the level at that frequency. Q is estimated from the bandwidth of the peak. F, Q and Gain are then used to design a single $2^{nd}$ order parametric filter using the bilinear transformation.

After the filter has been designed, a new target curve is computed. It is $$New\ target=old\ target*filter$$

Where * is convolution.

The algorithm continues to repeat the above procedure until all available filters are used up or the error criteria has been achieved.

It is also possible to equalize to a target curve, which is not just a flat or sloping line. This target curve for example could be dependent on the measurement. The measurement can clearly indicate all the room modes; for music, the system, may flatten the room modes but for playing movies, the system may use some of the room gain to an advantage.

As discussed above, FIG. 16 is a graph of a desired reference frequency response for a particular subwoofer 10. FIG.

17 is a graph illustrating a frequency response measurement 161 of the same subwoofer used in FIG. 16 taken in room A, with the subwoofer placed in one corner and the microphone about 3 meters away.

Figure 18:
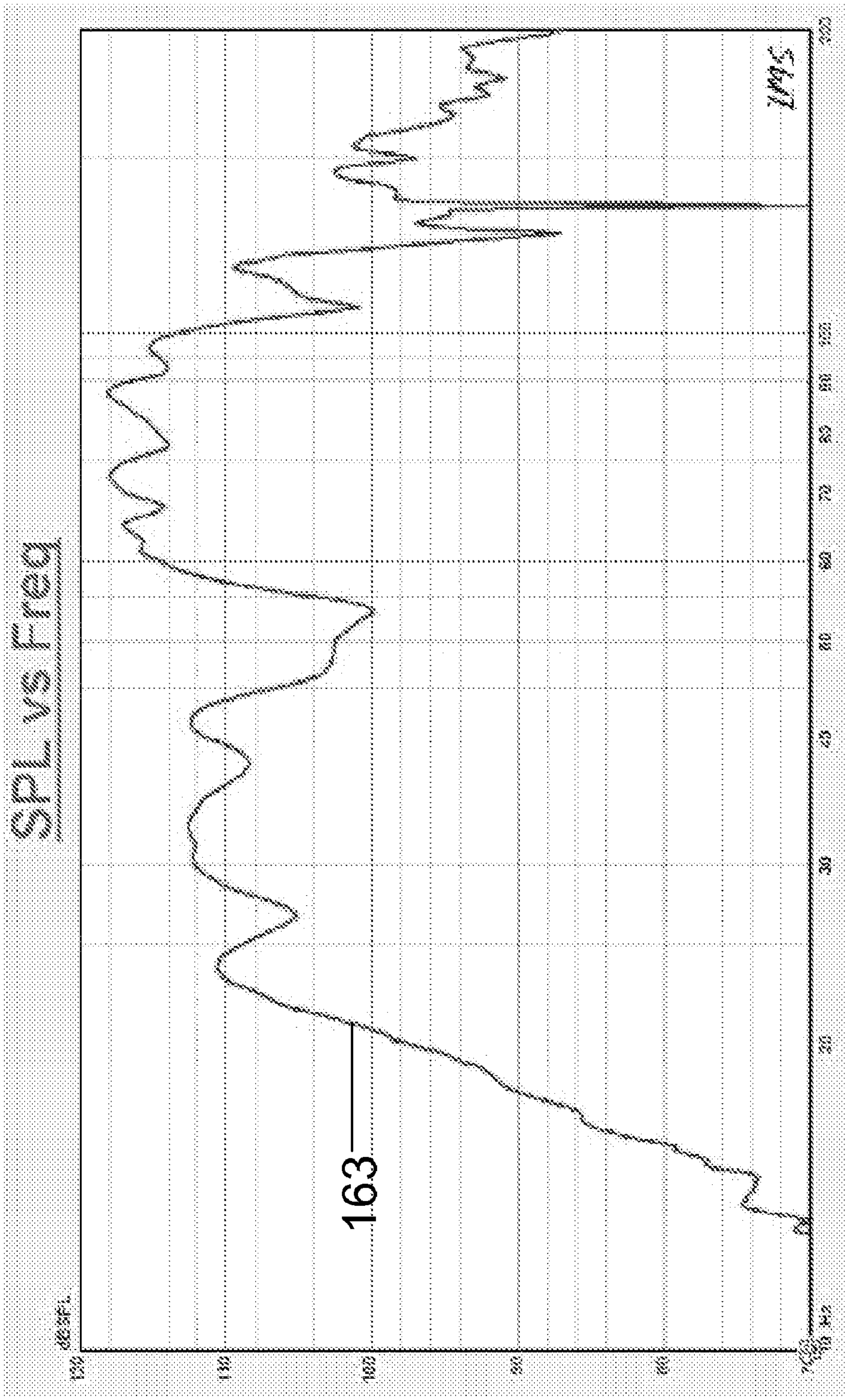

FIG. 18 is a graph illustrating a frequency response measurement 163 of the same subwoofer taken in room B, with the subwoofer placed in one corner and the microphone about 3 meters away.

Figure 19:
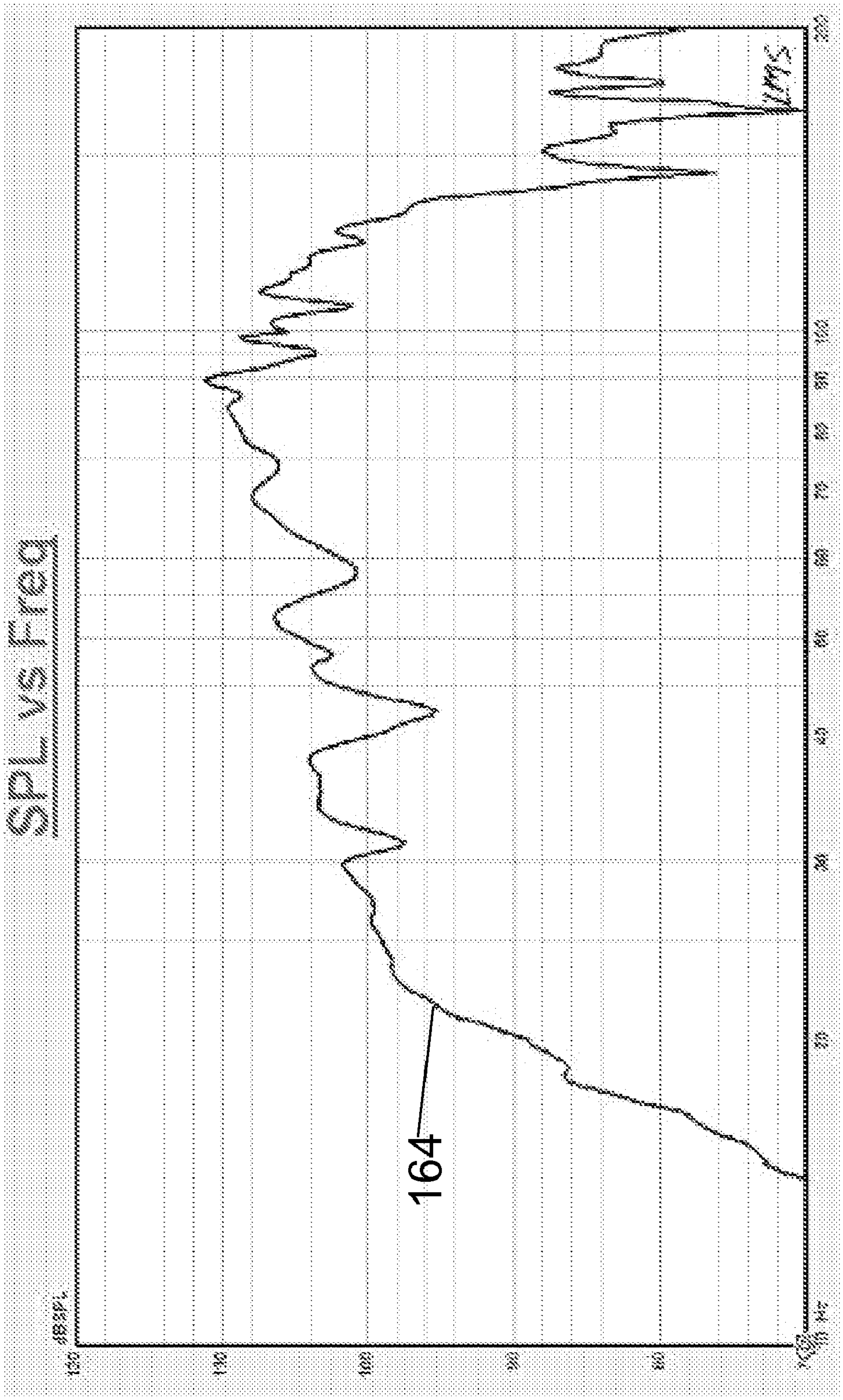

FIG. 19 is a graph illustrating a frequency response measurement 164 of the same subwoofer taken in room B, with the subwoofer placed 1 m from a corner and the microphone about 3 meters away.

Figure 20:
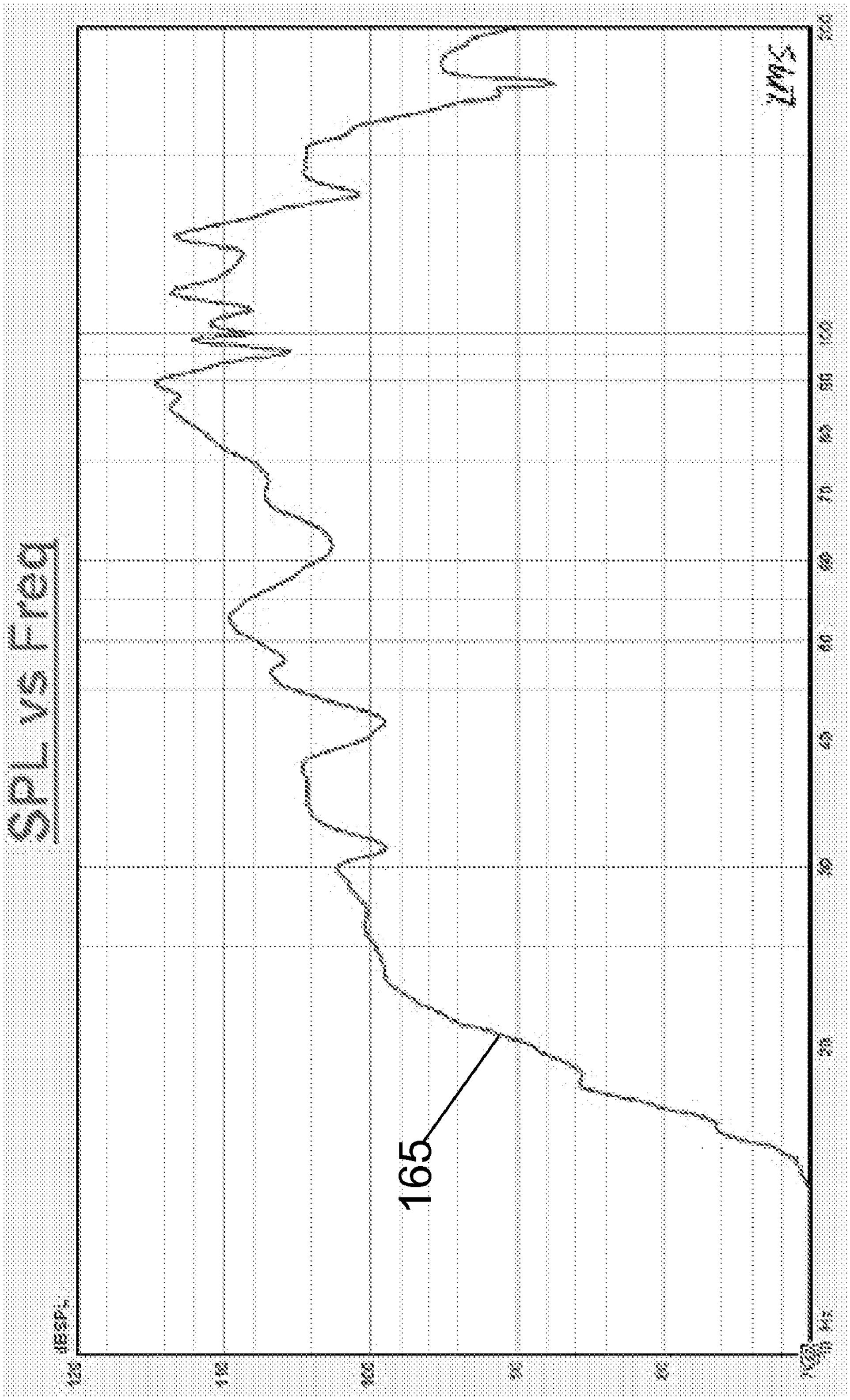

FIG. 20 is a graph illustrating a frequency response measurement 165 of the same subwoofer taken in room B, with the subwoofer placed in a different corner and the microphone about 3 meters away.

Figure 17:
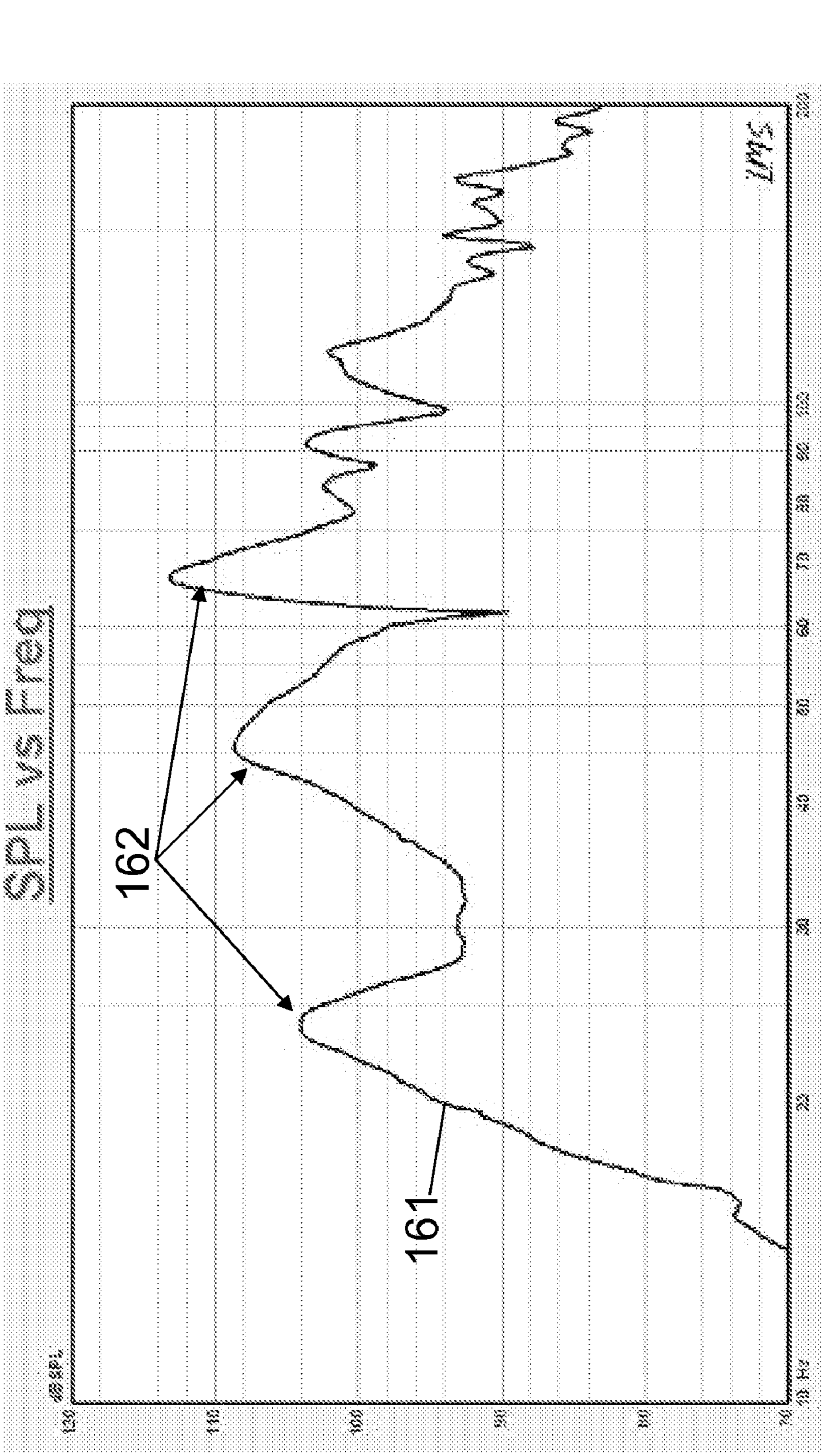
FIGS. 17-20 are graphs illustrating sound pressure level (SPL) measurements taken in different rooms and at various positions in those rooms.

Room A illustratively is a small room, and Room B illustratively is a very large room. FIG. 17 shows that Room A has very prominent room modes 162 and this has caused the room to have over 20 dB fluctuations in the measured frequency. This room, lacks ultra low frequency bass because of the dip at 30 Hz and the two large peaks at 45 Hz and 70 Hz make the sound very boomy. Room B, position 1 (FIG. 18) also sounds pretty bad because of nearly 20 dB fluctuations in the frequency response. The upper bass sounds very full and slow (slow to decay). Position 2 in room B (FIG. 19) has 16 dB of fluctuations in the frequency response and may be a better position to place a subwoofer in that room but it too will benefit from room correction. Room B, position 3 (FIG. 20) has a very uneven frequency response.

Figure 21:
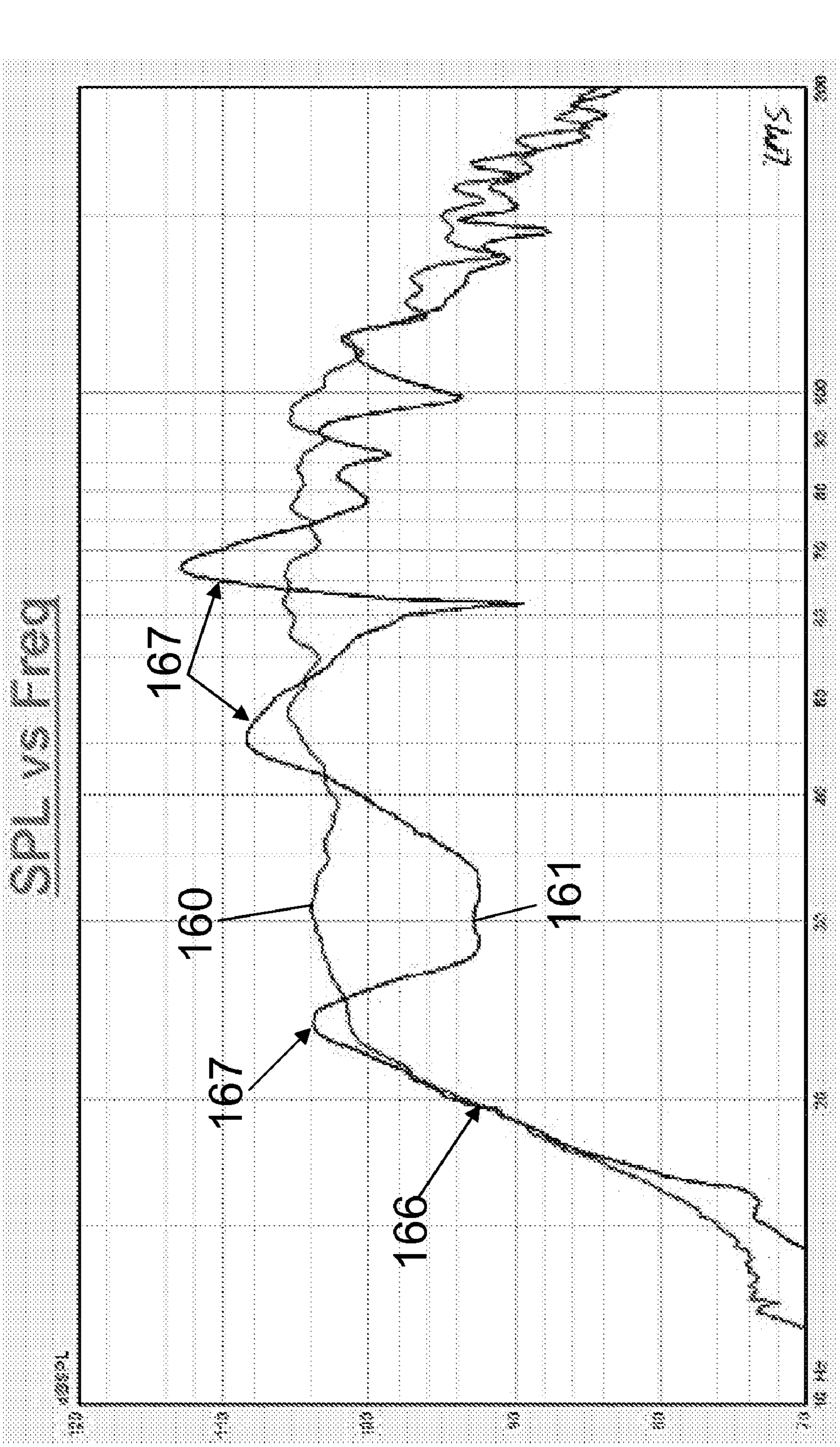
FIGS. 21-24 are graphs illustrating the SPL measurements of FIGS. 17-20, respectively, aligned with the reference frequency response of FIG. 16 such that the slopes of the curves at the lowest frequencies match.

FIG. 21 is a plot of both the frequency response 161 of room A from FIG. 17 and the reference frequency response 160 of FIG. 16. In other words, FIG. 21 is a graph illustrating a comparison of the measurements from FIG. 16 and FIG. 17. The room measurement frequency response 161 has been shifted up/down until the slope of the lowest frequency parts (between 15 to 25 Hz) matches the reference frequency response 160 as shown at location 166. Any peaks 167 above the reference frequency response curve 160 are room modes that should be flattened by the filters. Valleys or dips below the reference frequency response curve 160 are also room modes of the room, but are best left alone as discussed above.

Figure 22:
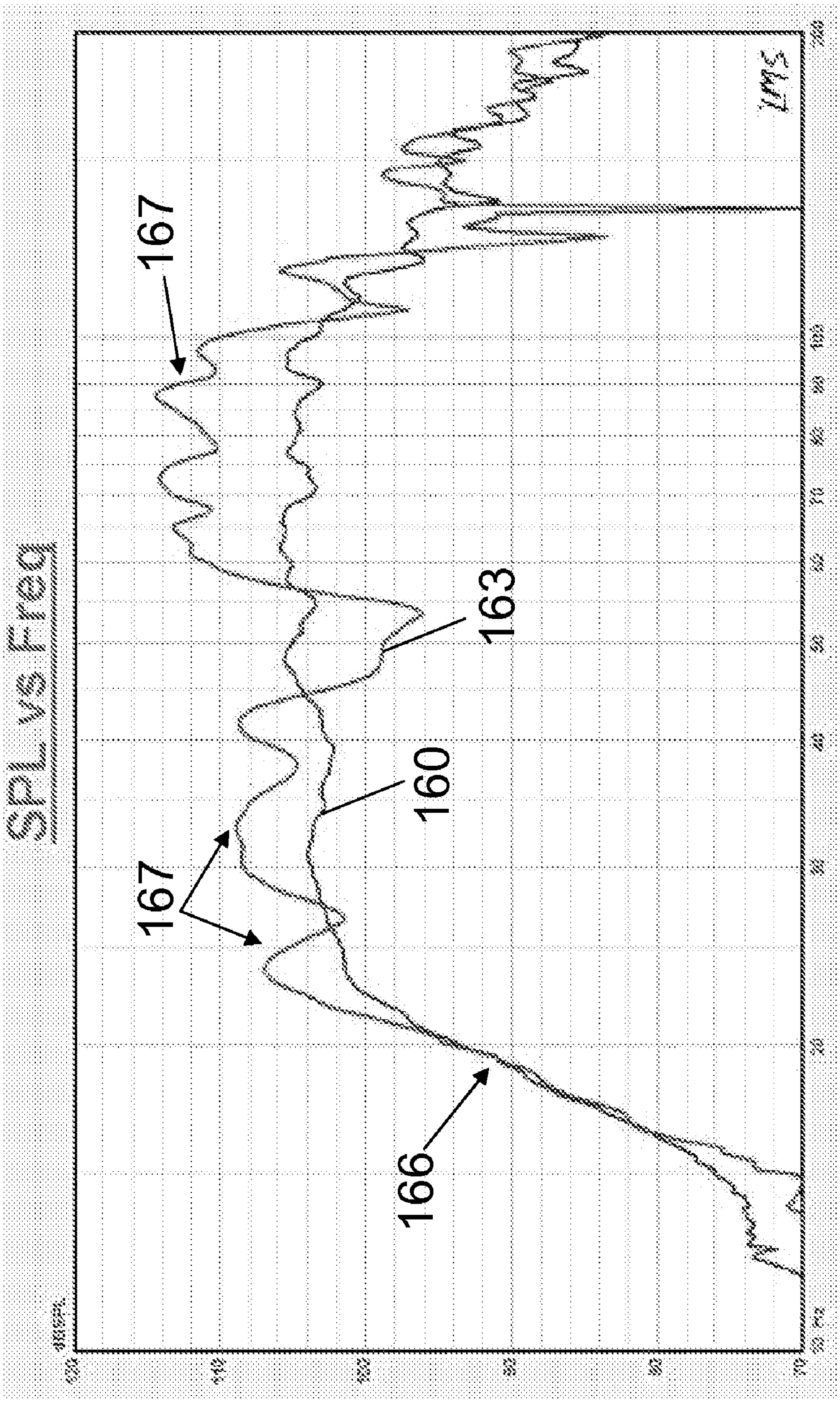

FIG. 22 is a graph illustrating a comparison of the frequency response 163 of room B, position 1 and reference frequency response 160. In other words, FIG. 22 is a graph illustrating a comparison of the measurements from FIG. 16 and FIG. 18. The room response 163 has been shifted up or down until the slope of the lowest frequencies (i.e. 10 to 25 Hz) matches the reference frequency response 160 as illustrated at location 166. FIG. 22 illustrates a very clear-cut example of standing waves. The peaks 167 will be filtered.

Figure 23:
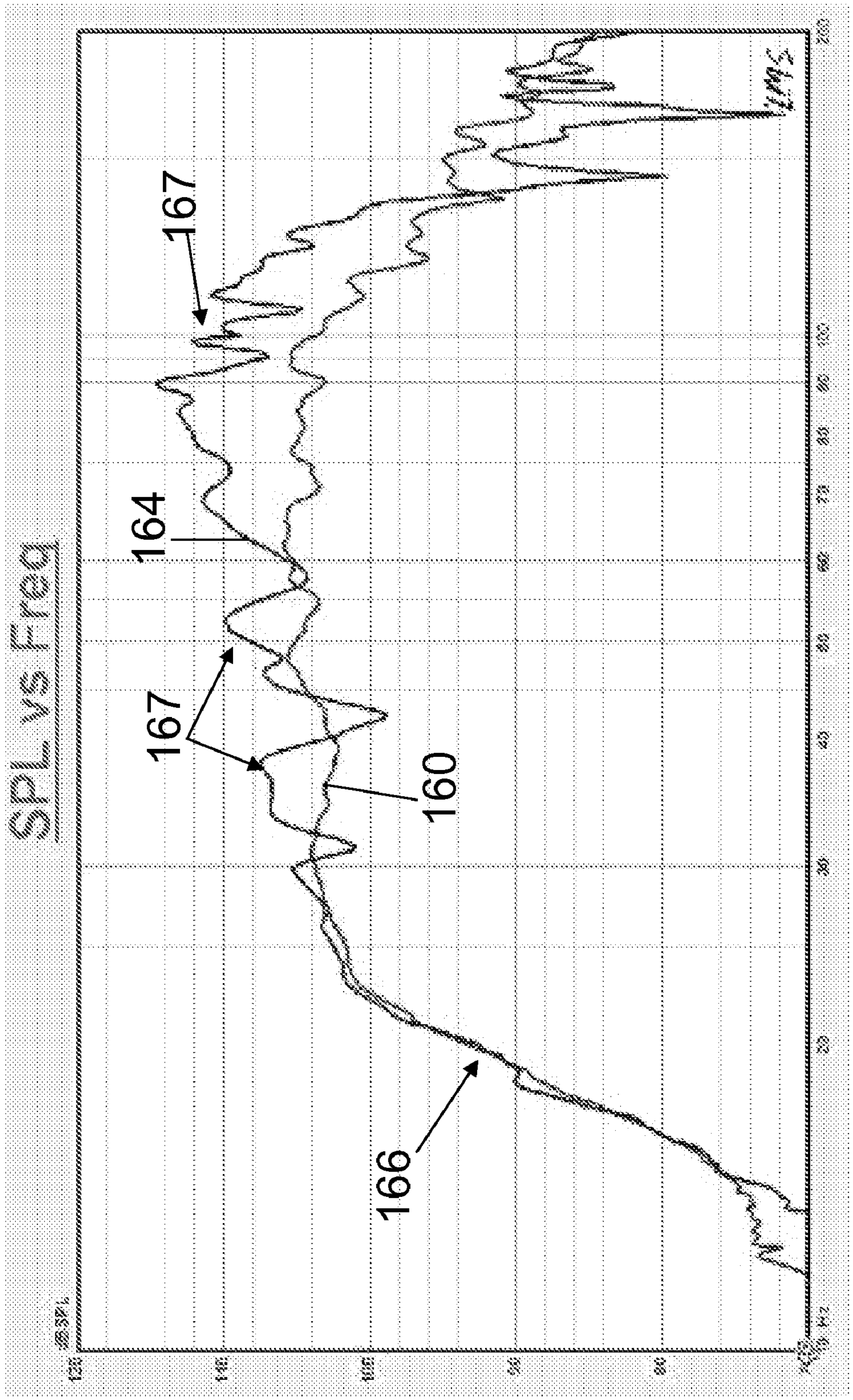

FIG. 23 is a graph illustrating a comparison of the measurements from FIG. 16 and FIG. 19. The room response 164 has been shifted up or down until the slope of the lowest frequencies (i.e. 10 to 25 Hz) matches the ground plane reference frequency response 160 as illustrated at location 166. Peaks 167 will be filtered.

Figure 24:
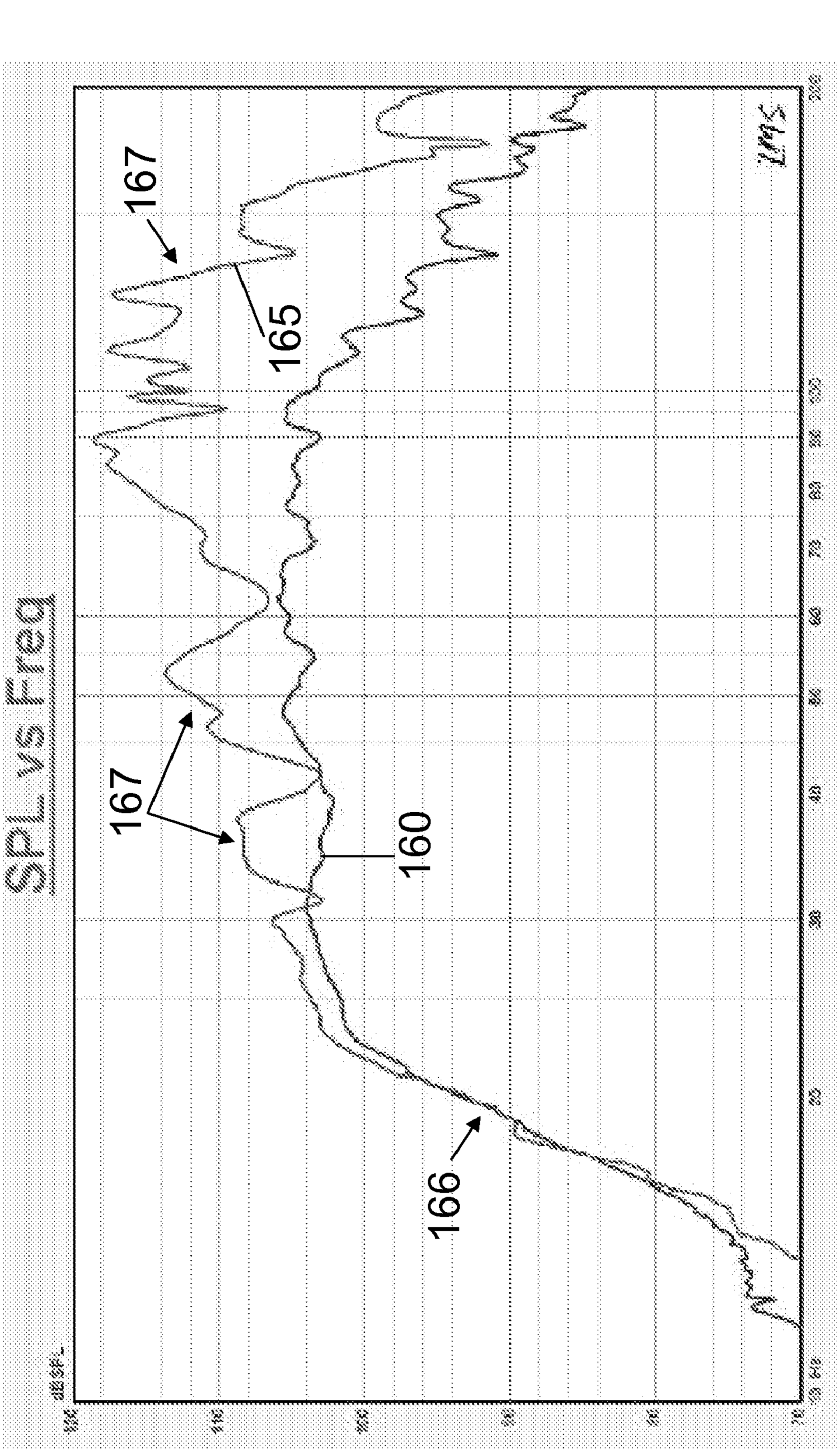

FIG. 24 is a graph illustrating a comparison of the measurements from FIG. 16 and FIG. 20. The room response 165 has been shifted up or down until the slope of the lowest frequencies (i.e. 10 to 25 Hz) matches the ground plane reference frequency response 160 as illustrated at location 166. Peaks 167 will be filtered.

FIGS. 22-24 illustrate that the room standing waves or modes are very position dependent on the position of the subwoofer 10 in the room. Clearly the room modes can not change for a given room, but how much they are excited is dependent on both the position of the subwoofer 10 as well as the position of the listener. So if a room has a mode at 30 Hz, that mode will always exist. The position of the subwoofer 10 will determine how much of that mode is excited and how much gain will exist at that frequency. This mode, dependent on if it is axial, tangential or oblique, will then exist in the room and the listener position will dictate how loud that frequency would be heard.

Figure 25:
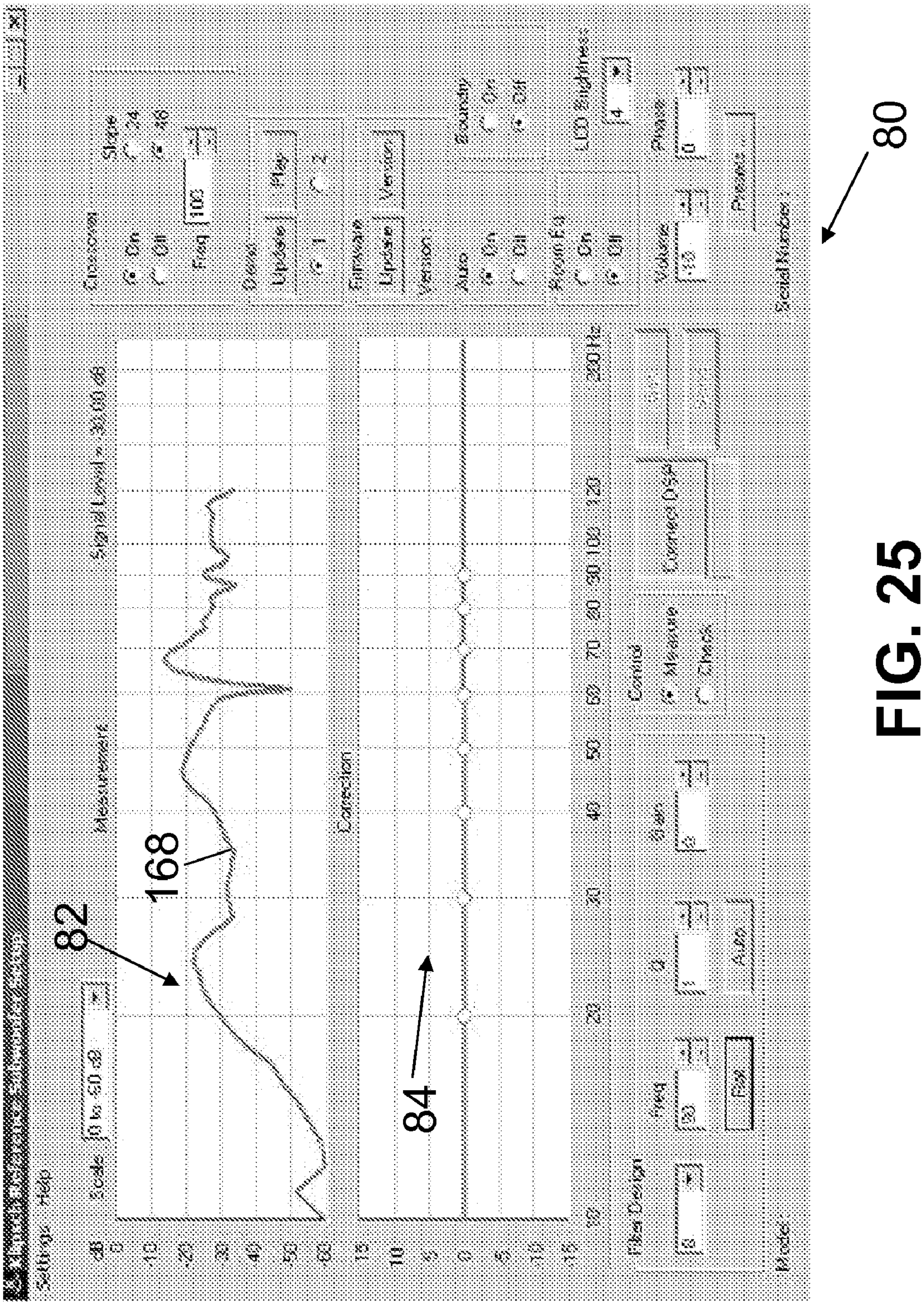
FIG. 25 is a screen shot illustrating a sample room frequency response to be equalized.

FIG. 25 shows a frequency response 168 as measured by the microphone 76 in a room is plotted at the top portion 82 of the screen 80. The bottom section 84 of screen 80 shows the response of the IIR filters. Any number of filters can be used to correct the room response but practically eight filters have been shown to correct most rooms.

Figure 26:
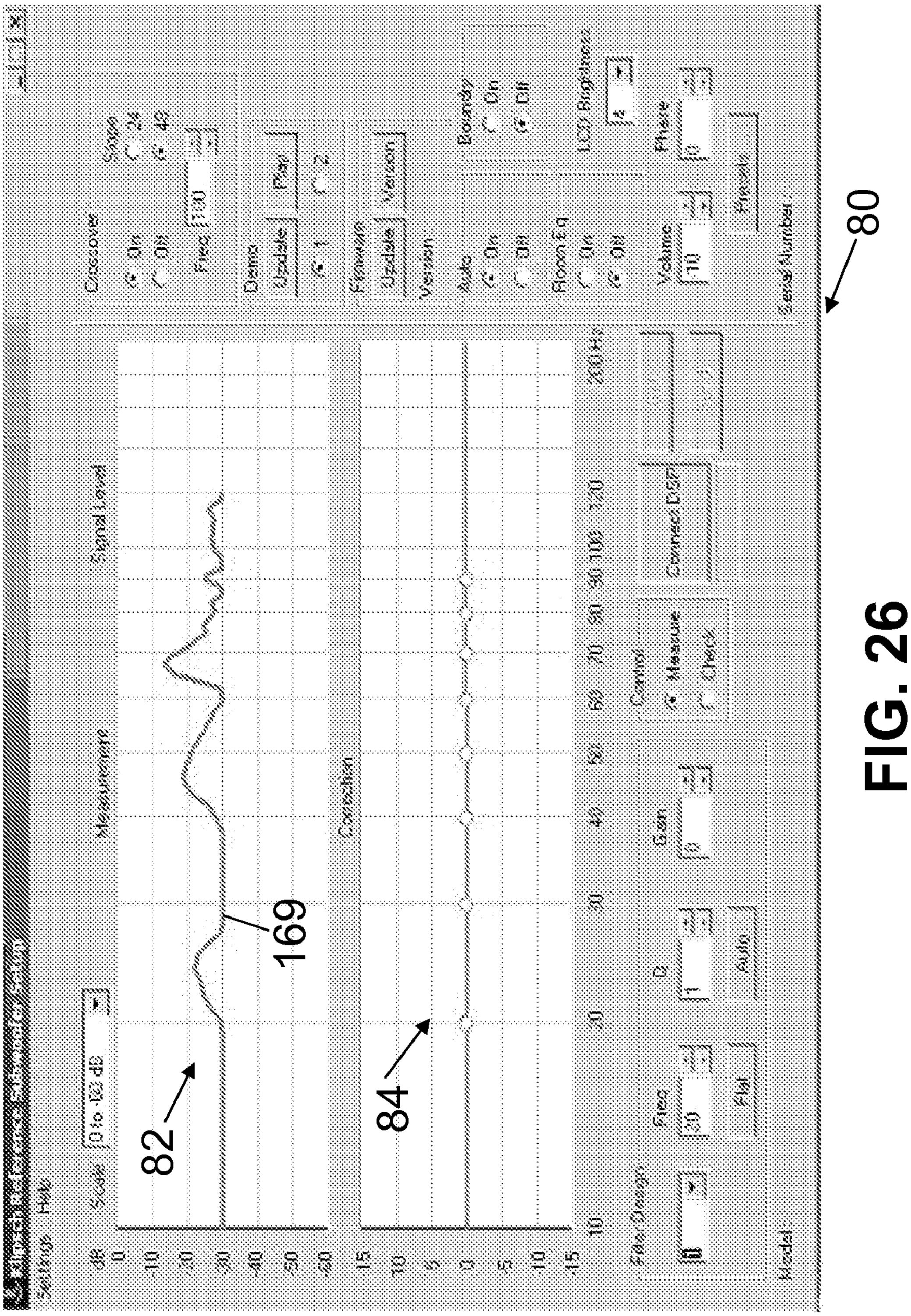
FIG. 26 is a screen shot illustrating a target curve worked out by a filtering algorithm.

FIG. 26 illustrates a top curve 169 which shows the target curve that has been worked out by filtering algorithm. This target curve has taken into account the subwoofer reference frequency response 160 in ½ space or a ⅛ space. The lower curve in section 89 is the frequency response of the correction filter.

In FIG. 7, the section 82 illustrate the original measurement frequency response 168 as shown in FIG. 25 and the equalized room response 170 that has been corrected by the automatic room-equalization algorithm. The lower curve 171 in section 84 is the filter frequency of the correction filter used to correct response 168. Note all eight filters are engaged now with various Frequencies, Q and Gain. Notice how most of the peaks in response 168 have been removed and the dips have been left alone. After correction, the room should sound much better, the boomy bass will be replaced by a clean sounding bass which decays fast.

As discussed above, FIG. 12 illustrates an example set-up during calibration. A microphone is attached to the subwoofer and placed near the sitting position. The calibration is started via the front buttons on the subwoofer. It is not necessary to have a PC in the room while calibrating. If a PC is connected during calibration or after the calibration is finished the frequency response of the subwoofer as picked up the microphone can be displayed. The resulting filters for room response can also be looked at and modified.

FIG. 27 illustrates an example filter design procedure. FIG. 27 shows the steps for measurement and room-mode estimation as discussed herein.

Figure 28:
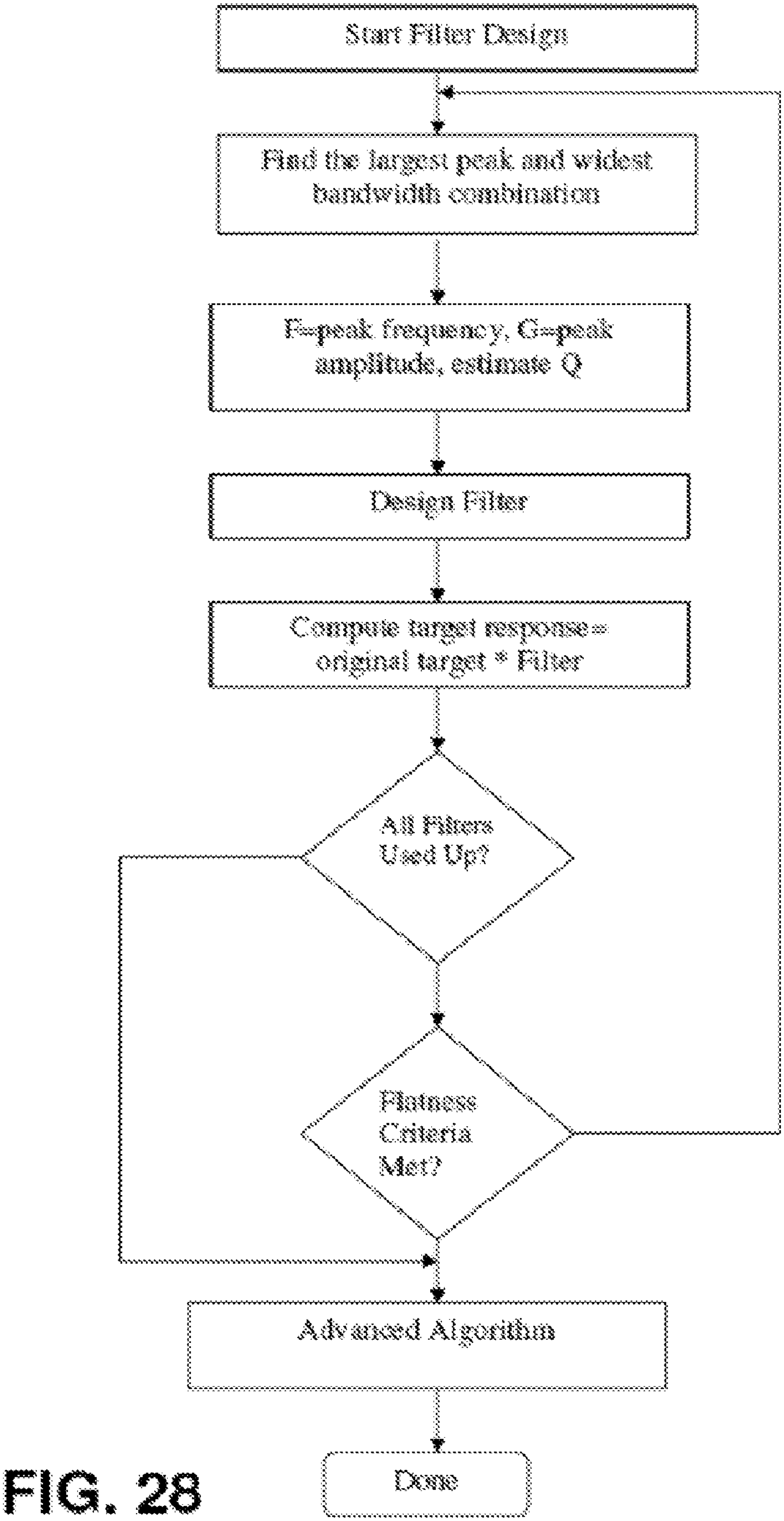
FIG. 28 is a flow chart illustrating a filter design algorithm.

FIG. 28 is an illustrative filter design algorithm. FIG. 28 illustrates the filter design procedure that is done by the DSP 50 in the subwoofer 10. This is a complex algorithm that requires a lot of computation power. However, because of the power of DSP 50, this step can be completed in a few microseconds.

Figure 29:
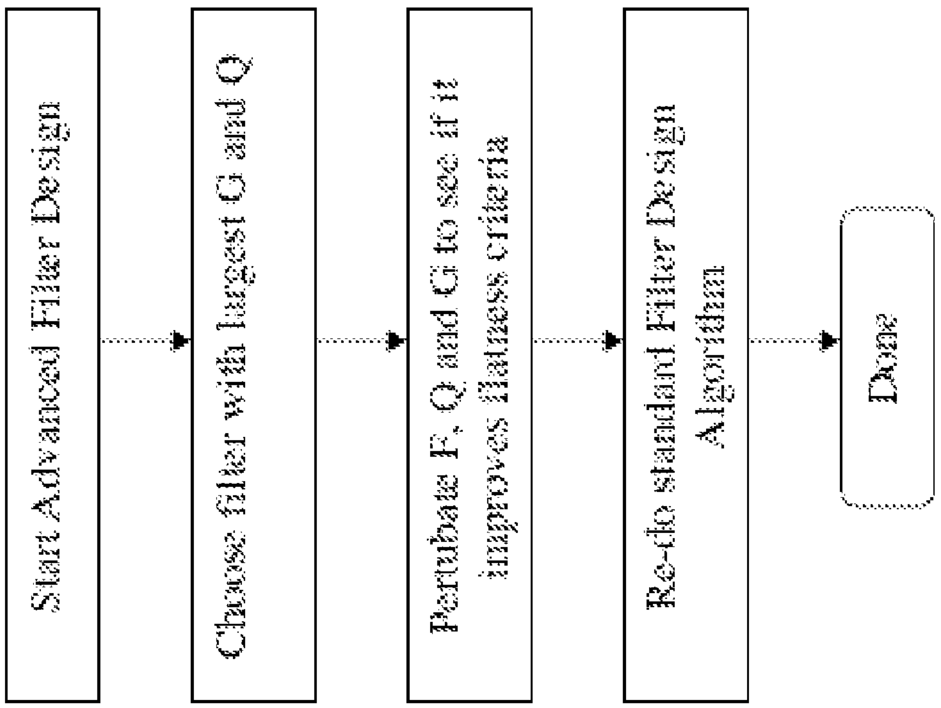
FIG. 29 is a flow chart illustrating an advanced filter design algorithm.

FIG. 29 is an illustrative advanced filter design algorithm. The advanced filter design algorithm may be necessary if the standard filter design algorithm does not meet the flatness criteria and all the filters have been used up. Because the filter design is non-linear a possibility exists that the filter design algorithm has found an answer that is a local minima and not a global minima. The way to check this is to take each filter and perturb the F, Q and G in a loop to see if the error will reduce as illustrated in FIG. 29.

Number of filters

To do room correction at low frequencies all room modes should be corrected to produce a flat frequency response. For a typical room of size 4 m by 6 m by 2.5 m there are 12 room modes below 90 Hz as shown in Table 1 above. To be able to do room correction for such a room, at least eight filters would be needed. Once the room response has been measured a number of solutions exist for room correction. Traditionally people have used graphic equalizers and they are used to changing the gain, as the gain is the only parameter that is variable in an equalizer. The digital world allows not only the gain to be changed easily but also the Q and Frequency.

The illustrated embodiment is a fully automated system. There is little chance of an operator ruining the sound quality by tweaking the three variables. In a non-automated system it is very difficult to decide how to equalize because there is a large degree of freedom of variables. As equalizers are made up of parametric filters, this is not necessarily the best use of DSP power for room correction. All filters like low-pass, high-pass, band-pass, band-stop and shelving filters can be used for correction. The low-pass, high-pass, band-pass, band-stop, shelving and parametric filters are all examples of $2^{nd}$ order IIR filters. The ideal way to convert the room correction from the measurement (which is in the frequency domain) is Fletcher's algorithm. The frequency domain correction response can also be converted into a time-domain minimum phase signal and then algorithms like Prony or Shanks can be used. This would produce a more accurate correction because Prony or Shanks are mathematical (non-recursive) algorithms that reduce the error in a least-squares sense. Once the algorithm like Shanks, Prony, Fletcher or any other ARMA design algorithm has been used, the calculated filters can be converted into $2^{nd}$ order cascade or parallel form for reduced finite word length effects. The filter design using such methods will be optimal in a least squares sense but will not produce just parametric filters. Thus tweaking of the frequency response by a user will involve recalculating the new response via the chosen algorithm. This is not an issue but actually beneficial as the user will have to modify the required frequency response rather than change a filter's Frequency, Q or gain and then see the affect.

Although the illustrated embodiment uses mainly frequency equalization to modify the output of the loudspeaker based on comparing a measured frequency response to a reference frequency response signal, it is understood that other techniques may be used. For instance, selectively delaying the output signal, phase change, or other processing techniques may be used in accordance with the present invention to modify the output of the loudspeaker and/or match the output of the loudspeaker to other speakers in the room.

Although the invention has been described in detail with reference to certain illustrated embodiments, variations and modifications exist within the spirit and scope of the invention.

What is claimed is:

1. A method of improving sound quality of a loudspeaker in a room, the method comprising:

providing a reference frequency response signal indicating a desired frequency response for the loudspeaker;

measuring a frequency response of an output of the loudspeaker in the room;

comparing the measured frequency response in the room to the reference frequency response signal;

identifying at least one peak in the measured room frequency response which has a higher sound level than corresponding a sound level of the reference frequency response signal; and modifying the output of the loudspeaker to reduce the at least one peak identified in the identifying step without adjusting portions of the output of the loudspeaker having sound levels below corresponding sound levels of the reference frequency response signal.

2. The method of claim 1, wherein the step of providing a reference frequency response signal comprises measuring a frequency response of the loudspeaker in ½ space, and storing the measured ½ space frequency response for use as the reference frequency response signal.

3. The method of claim 1, wherein the step of measuring a frequency response of the output of the loudspeaker in the room comprises connecting a transducer to the speaker, initiating a chirp sequence over a predetermined frequency range for a predetermined time period, detecting sound levels at different frequencies within the frequency range, and storing the detected sound levels.

4. The method of claim 3, wherein the chirp frequency range is from about 10 Hz to about 120 Hz.

5. The method of claim 3, wherein the predetermined time period of the chirp sequence is greater than 10 seconds.

6. The method of claim 3, wherein the detecting step comprises measuring a peak sound level generated in the room by the output of the loudspeaker at predetermined time intervals and storing the measured peak sound levels corresponding to different frequencies within the frequency range of the chirp sequence.

7. The method of claim 6, further comprising converting the measured peak sound levels to sound pressure levels.

8. The method of claim 6, further comprising adjusting the frequency of the chirp after each predetermined time interval.

9. The method of claim 1, further comprising matching the reference frequency response signal with the measured frequency response by aligning the reference frequency response signal with the measured frequency response in a low frequency range prior to the comparing step.

10. The method of claim 1, wherein the identifying step includes identifying the largest peak and widest bandwidth combinations in the measured frequency response compared to the reference frequency response signal.

11. The method of claim 1, wherein the measuring step includes measuring a frequency response of the output signal in at least two different locations in the room and determining a combined measured frequency response based on the frequency response measurements taken in the at least two different locations in the room.

12. The method of claim 1, wherein the step of modifying the output of the loudspeaker uses frequency equalization.

13. The method of claim 1, wherein the step of modifying the output of the loudspeaker uses at least one of delay and phase change.

14. The method of claim 1, wherein the step of providing a reference frequency response signal comprises measuring an actual frequency response of the loudspeaker under a controlled condition and using the actual measured frequency response as the reference frequency response signal.

15. A method of improving sound quality of a loudspeaker in a room, the method comprising:

providing a reference frequency response signal indicating a desired frequency response for the loudspeaker;

placing the loudspeaker in the room;

initiating a chirp sequence over a predetermined frequency range for a predetermined time period greater than 10 seconds;

detecting sound levels of an output of the loudspeaker at different frequencies within the frequency range during the chirp sequence;

storing the detected sound levels to provide a measured frequency response of the output of the loudspeaker in the room;

comparing the measured frequency response to the reference frequency response signal; and modifying the output of the loudspeaker based on the results of the comparing step.

16. The method of claim 15, wherein the predetermined time period of the chirp sequence is greater than or equal to 48 seconds.

17. The method of claim 15, wherein the predetermined time period of the chirp sequence is greater than or equal to 55 seconds.

18. The method of claim 15, wherein the step of providing a reference frequency response signal comprises measuring a frequency response of the loudspeaker in ½ space, and storing the measured ½ space frequency response for use as the reference frequency response signal.

19. The method of claim 15, wherein the chirp frequency range is from about 10 Hz to about 120 Hz.

20. The method of claim 19, wherein the detecting step comprises measuring a peak sound level generated in the room by the output of the loudspeaker over a predetermined time period at different frequencies within the frequency range and storing the measured peak sound levels.

21. The method of claim 20, further comprising converting the measured peak sound levels to sound pressure levels.

22. The method of claim 15, further comprising matching the reference frequency response signal with the measured frequency response by aligning the reference frequency response signal with the measured frequency response in a low frequency range prior to the comparing step.

23. The method of claim 15, wherein the chirp sequence is generated at 1 Hz intervals within the frequency range.

24. The method of claim 23, a sound level of the output of the loudspeaker is detected and stored at each 1 Hz interval of the chirp sequence.

25. The method of claim 15, wherein the measuring step includes measuring a frequency response of the output signal in at least two different locations in the room and determining a combined measured frequency response based on the frequency response measurements taken in the at least two different locations in the room.

26. The method of claim 15, wherein the step of modifying the output of the loudspeaker uses frequency equalization.

27. The method of claim 15, wherein the step of modifying the output of the loudspeaker uses at least one of delay and phase change.

28. A method of improving sound quality of a loudspeaker in a room, the method comprising:

providing a reference frequency response signal indicating a desired frequency response for the loudspeaker;

measuring a frequency response of an output of the loudspeaker in the room;

matching the reference frequency response signal with the measured frequency response by aligning the reference frequency response signal with the measured frequency response in a low frequency range;

comparing the measured frequency response in the room to the reference frequency response signal after the matching step; and modifying the output of the loudspeaker based on the results of the comparing step.

29. The method of claim 28, wherein the low frequency range for matching the reference frequency response signal with the measured frequency response is about 15 to about 25 Hz.

30. The method of claim 28, wherein matching step is based on aligning a slope of the reference frequency response signal with a slope of the measured frequency response in the low frequency range.

31. The method of claim 28, wherein matching step is based on aligning sound pressure levels of the reference frequency response signal with sound pressure levels of the measured frequency response in the low frequency range.

32. The method of claim 28, wherein the measuring step includes measuring a frequency response of the output signal in at least two different locations in the room and determining a combined measured frequency response based on the frequency response measurements taken in the at least two different locations in the room.

33. The method of claim 28, wherein the step of modifying the output of the loudspeaker uses frequency equalization.

34. The method of claim 28, wherein the step of modifying the output of the loudspeaker uses at least one of delay and phase change.

35. The method of claim 28, further comprising determining whether a difference between wherein the measured frequency response in the room and the reference frequency response signal exceeds a predetermined level after the matching step, and rematching the reference frequency response signal with the measured frequency response if the difference exceeds the predetermined level.

* * * * *